(12) United States Patent
Lloyd et al.

(10) Patent No.: US 11,765,474 B2
(45) Date of Patent: Sep. 19, 2023

(54) PIXEL ARRANGEMENT, IMAGE SENSOR AND METHOD OF OPERATING A PIXEL ARRANGEMENT

(71) Applicants: ams Sensors USA Inc., Plano, TX (US); ams Sensors Belgium BVBA, Berchem (BE)

(72) Inventors: Denver Lloyd, Boise, ID (US); Adi Xhakoni, Kessel Lo (BE); Scott Johnson, Boise, ID (US)

(73) Assignees: ams Sensors USA Inc., Plano, TX (US); ams Sensors Belgium BVBA, Berchem (BE)

( * ) Notice: Subject to any disclaimer, the term of this patent is extended or adjusted under 35 U.S.C. 154(b) by 0 days.

(21) Appl. No.: 17/818,938

(22) Filed: Aug. 10, 2022

(65) Prior Publication Data

US 2023/0049844 A1 Feb. 16, 2023

Related U.S. Application Data

(60) Provisional application No. 63/263,861, filed on Nov. 10, 2021.

(30) Foreign Application Priority Data

Aug. 10, 2021 (DE) .......................... 102021120779.7

(51) Int. Cl.
*H04N 25/59* (2023.01)
*H04N 25/778* (2023.01)
(Continued)

(52) U.S. Cl.
CPC ....... *H04N 25/59* (2023.01); *H01L 27/14612* (2013.01); *H01L 27/14643* (2013.01);
(Continued)

(58) Field of Classification Search
CPC .... H04N 25/59; H04N 25/531; H04N 25/583; H04N 25/585; H04N 25/62; H04N 25/75;
(Continued)

(56) References Cited

U.S. PATENT DOCUMENTS

| | | |
|---|---|---|
| 10,250,832 B1 | 4/2019 | Xu et al. |
| 11,218,653 B2 | 1/2022 | Yang et al. |

(Continued)

FOREIGN PATENT DOCUMENTS

| | | | |
|---|---|---|---|
| DE | 102020004050 A1 | 1/2021 | |
| EP | 1732315 A1 | 12/2006 | |

(Continued)

OTHER PUBLICATIONS

Asatsuma, T. et al., "Sub-pixel Architecture of CMOS Image Sensor Achieving over 120 dB Dynamic Range with less Motion Artifact Characteristics," Semantic Scholar, Published 2019, 4 pages.

(Continued)

*Primary Examiner* — Nhan T Tran
(74) *Attorney, Agent, or Firm* — Slater Matsil, LLP

(57) ABSTRACT

In an embodiment a pixel arrangement includes at least one photodiode configured to convert electromagnetic radiation into a respective charge signal, a transfer gate between the photodiode and a capacitance for transferring the respective charge signal to the capacitance, a reset gate electrically coupled to the capacitance, the reset gate configured to reset the capacitance, an amplifier electrically connected to the capacitance and configured to generate, based on the respective charge signal and on a sensitivity mode, a respective amplified signal being a low sensitivity signal or a high sensitivity signal, respectively, wherein the low sensitivity signal and the high sensitivity signal are based on a common noise level, a first capacitor configured to store the high sensitivity signal, a second capacitor configured to store the (Continued)

low sensitivity signal, a first switch between an output terminal of the amplifier and the first capacitor and a second switch between the output terminal of the amplifier and the second capacitor.

19 Claims, 8 Drawing Sheets

(51) Int. Cl.
    *H04N 25/75*     (2023.01)
    *H04N 25/531*    (2023.01)
    *H04N 25/585*    (2023.01)
    *H04N 25/62*     (2023.01)
    *H04N 25/583*    (2023.01)
    *H01L 27/146*    (2006.01)

(52) U.S. Cl.
    CPC ......... *H04N 25/531* (2023.01); *H04N 25/583* (2023.01); *H04N 25/585* (2023.01); *H04N 25/62* (2023.01); *H04N 25/75* (2023.01); *H04N 25/778* (2023.01)

(58) Field of Classification Search
    CPC .. H04N 25/778; H04N 25/616; H04N 25/771; H04N 25/589; H01L 27/14612; H01L 27/14643
    See application file for complete search history.

(56) References Cited

U.S. PATENT DOCUMENTS

| | | | | |
|---|---|---|---|---|
| 2002/0190215 | A1* | 12/2002 | Tashiro | H04N 5/325 348/E5.088 |
| 2009/0256060 | A1* | 10/2009 | Meynants | H04N 25/771 250/214 A |
| 2011/0242381 | A1* | 10/2011 | Sakakibara | H04N 25/75 348/301 |
| 2017/0324916 | A1 | 11/2017 | Sugawa et al. | |
| 2019/0094394 | A1 | 3/2019 | Matsumoto | |
| 2020/0174122 | A1 | 6/2020 | Kimura | |
| 2020/0244900 | A1 | 7/2020 | Hynecek | |
| 2021/0051283 | A1* | 2/2021 | Cowley | H04N 25/75 |
| 2021/0160448 | A1 | 5/2021 | Seo et al. | |
| 2022/0321759 | A1* | 10/2022 | Miyauchi | H04N 25/583 |

FOREIGN PATENT DOCUMENTS

| | | |
|---|---|---|
| EP | 1681850 B1 | 3/2010 |
| EP | 1259066 B1 | 9/2012 |
| EP | 2587794 A2 | 5/2013 |
| EP | 2288142 B1 | 1/2014 |
| WO | 2004074789 A1 | 9/2004 |

OTHER PUBLICATIONS

Miyauchi, K. et al., "A high optical Performance 2.8 μm BSI LOFIC Pixel with 120ke FWC and 160 μV/e conversion Gain," 2019 International Image Sensor Workshop (IISW), Jun. 23-27, 2019, 4 pages.

Mori, K. et al., "Back Side Illuminated High Dynamic Range 4.0 μm Voltage Domain Global Shutter Pixel with Multiple Gain Readout," 2019 International Image Sensor Workshop (IISW), Jun. 23-27, 2019, 4 pages.

Oh, M et al., "3.0 μm Backside Illuminated, Lateral Overflow, High Dynamic Range, LED Flicker Mitigation Image Sensor," Semantic Scholar, Published 2019, 4 pages.

Solhusvik, J. et al., "A 1280×960 2.8 μm HDR CIS with DCG and Split-Pixel Combined," Semantic Scholar, Published 2019, 4 pages.

* cited by examiner

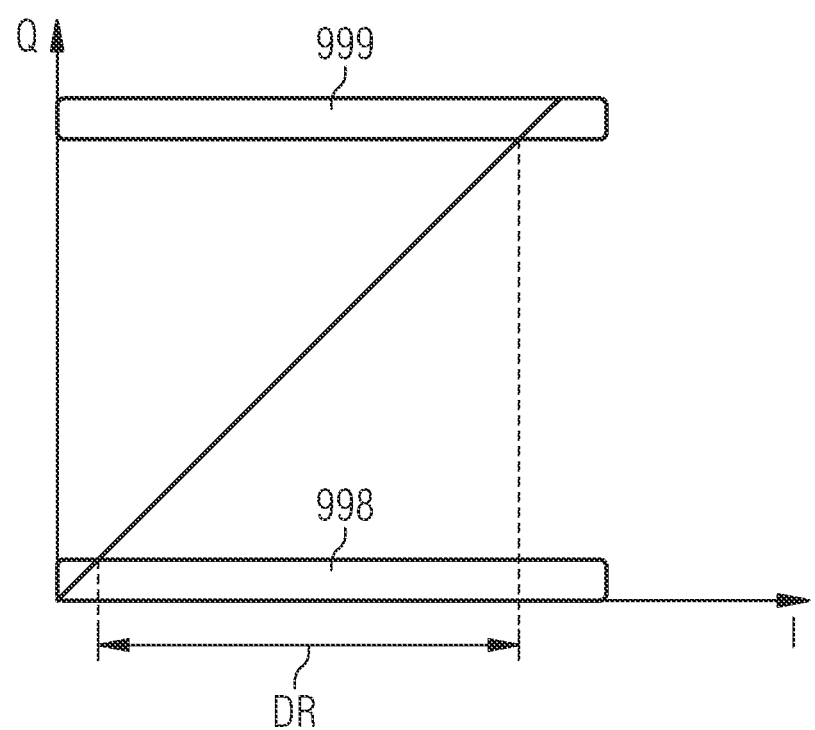

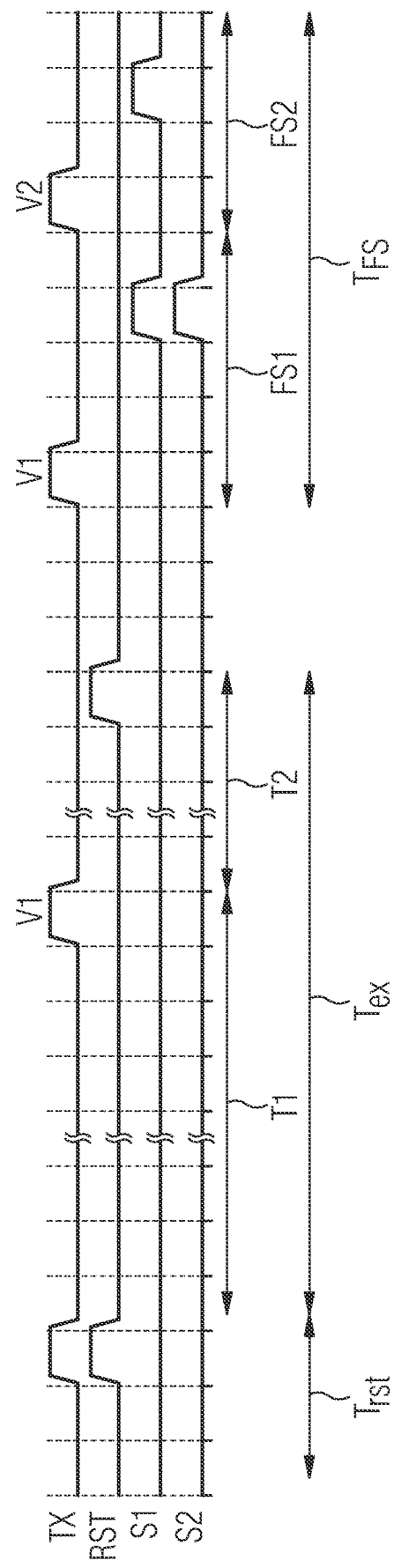

PIXEL ARRANGEMENT, IMAGE SENSOR AND METHOD OF OPERATING A PIXEL ARRANGEMENT

CROSS-REFERENCE TO RELATED APPLICATIONS

This application claims the benefit of U.S. Provisional Application No. 63/263,861, filed on Nov. 10, 2021, and German Patent Application No. 102021120779.7, filed on Aug. 10, 2021 which applications are hereby incorporated herein by reference.

TECHNICAL FIELD

The present invention relates to pixel arrangement, an image sensor, an optoelectronic device and a method for operating a pixel arrangement.

BACKGROUND

CMOS image sensors are used in a wide range of applications, such as for camera modules and smartphones, tablet computers, laptops etc. For some applications a high dynamic range (HDR), for example above 85 dB, is required. The dynamic range (DR) is limited on the one side by the noise floor at low light conditions, and by saturation effects at high light conditions on the other side.

To address the saturation issues some approaches have been developed, which can be categorized into linear response approaches and non-linear response approaches. For example, logarithmic compression, knee compression, timestamp conversion, light to frequency conversion belong to the non-linear response approaches. The linear response approaches can be further subcategorized into multiple exposure and single exposure approaches. Multiple exposure approaches include methods with multiple frames having different integration times or methods with line or pixels interleaves having different integration times. Single exposure approaches include multiple gain readout or multiple-sensitivity composites, for example.

Most of the available DR techniques have the problem of being designed for rolling shutter pixels, but not being global shutter friendly. In rolling shutter mode the pixels of a pixel matrix are illuminated by a light source. During illumination the pixels are sequentially exposed and read out row-by-row. This means, the pixel matrix is illuminated during the whole readout process. The rolling shutter mode enables a high resolution of the image sensor, but could come with other drawbacks like long illumination times and dynamic or color artifacts, especially if the rolling shutter mode is combined with one of the before-mentioned DR techniques.

In global shutter mode all the pixels of the pixel matrix are exposed during the same time period. Therefore, a significantly shorter illumination time is required than for the rolling shutter mode. At the end of integration time, the charge transfer operations for all rows of the pixel matrix happen simultaneously. The signals are stored in a pixel level memory and subsequently read out. Known global shutter pixel arrangements including one of the before-mentioned DR techniques suffer from needing additional circuit components and having large pixel pitches.

SUMMARY

Embodiments provide a pixel arrangement with a high dynamic range and a method for operating such pixel arrangement. Further embodiments provide an image sensor comprising an array of pixels according to the pixel arrangement and an optoelectronic device comprising such image sensor.

Here and in the following, the terms "pixel arrangement" and "pixel", refer to a light receiving element, which might be arranged in a two-dimensional array, also called matrix, with other pixels. Pixels in the array are arranged in rows and columns. The terms "row" and "column" can be used interchangeably, since they depend only on the orientation of the pixel array. The pixel might also include circuitry for controlling signals to and from the pixel. Thus, the pixel may form a so-called active pixel. The pixel may receive light in an arbitrary wavelength range. The term "light" may refer to electromagnetic radiation in general, including infrared (IR) radiation, ultraviolet (UV) radiation and visible (VIS) light, for example.

In an embodiment, a pixel arrangement is configured to convert electromagnetic radiation in a high sensitivity mode and a low sensitivity mode, respectively. The pixel comprises at least one photodiode. The photodiode is configured to convert electromagnetic radiation into a respective charge signal. The pixel arrangement may in particular form a global shutter pixel. The photodiode may in particular be a pinned photodiode. The photodiode may be arranged in a substrate, in particular a semiconductor substrate.

The high sensitivity mode and the low sensitivity mode are operational modes of the pixel. The high sensitivity mode and the low sensitivity mode may be executed subsequently. This can mean that the high sensitivity mode and the low sensitivity mode are executed within one frame. In particular, the low sensitivity mode might be executed prior to the high sensitivity mode. The low sensitivity mode of the pixel may be provided for high light conditions, i.e. high illuminance. In this case, the charge signal generated by the photodiode is already large and does not need to be "artificially" increased, for example by a high gain, long exposure times etc. If such charge signal was increased, for example by a high conversion gain (HCG), saturation effects could occur. Saturation could occur, for example, because the potential well of the photodiode and/or of a storage element within the pixel is not sufficiently large to carry all photo-induced charge carriers. The high sensitivity mode of the pixel may be provided for low light conditions, i.e. low illuminance. In that case, the charge signal generated by the photodiode is small and should be increased, for example by a high gain or long exposure times, in order to obtain a good signal-to-noise ratio (SNR).

In other words, the low sensitivity mode may be an operational mode, in which the exposure time of the pixel is short, in particular shorter than the exposure time of the high sensitivity mode. Alternatively, in the low sensitivity mode a low conversion gain (LCG) is applied. In still another alternative, the charge signal is kept small by means of a small photodiode area or respective filters. The high sensitivity mode may be an operational mode, in which the exposure time of the pixel is long, in particular longer than the exposure time of the low sensitivity mode. Alternatively, in the high sensitivity mode the signal gain may be large. In still another alternative, the charge signal is increased by means of a large photodiode area or the like. In still another embodiment, the high sensitivity mode and the low sensitivity mode are realized by barrier modulation of a transfer gate.

The pixel arrangement further comprises at least one transfer gate, which is arranged between the photodiode and a capacitance. The transfer gate is configured to transfer the respective charge signal from the photodiode to the capacitance.

The transfer gate may be implemented as transfer switch. For example, the transfer gate may be part of a transfer transistor comprising a first terminal connected to the photodiode and second terminal connected to the capacitance. By applying a transfer signal to the transfer gate the transfer transistor becomes conductive, such that charge carriers diffuse from the photodiode towards the capacitance. Thus, the capacitance may be implemented as floating diffusion capacitance. The capacitance forms a storage element. The capacitance may be called floating diffusion capacitor. The capacitance may form a doped well in the semiconductor substrate. The capacitance may be configured to transform the respective charge signal into a respective voltage signal. It may be desired to store the signal in the voltage domain rather than in the charge domain for dark current reasons and to reduce the parasitic light sensitivity (PLS) of the pixel.

The capacitance comprises a terminal node that is electrically coupled to the transfer gate. Thus, the transfer gate is arranged between the photodiode and the terminal node of the capacitance. The terminal node of the capacitance may be called floating diffusion node or FD node or diffusion node. The capacitance further comprises a further terminal node that may be grounded.

The capacitance may be a capacitance of the diffusion node. The capacitance may be implemented as a pn-junction. In an example, there is no discrete capacitor connected to the diffusion node. The capacitance results e.g. only from at least one parasitic capacitance. Thus, the terms "capacitance" and "diffusion node" may be used interchangeably in the following.

The pixel arrangement further comprises a reset gate, which is electrically coupled to the capacitance. In particular, the reset gate is electrically coupled to the FD node. The reset gate is provided for resetting the capacitance.

The reset gate may be implemented as reset switch. For example, the reset gate may be part of a reset transistor comprising a first terminal connected to a pixel supply voltage and a second terminal connected to the FD node. By applying a reset signal to the reset gate the reset transistor becomes conductive, such that any redundant charge carriers are removed by applying the pixel supply voltage.

The pixel arrangement further comprises an amplifier. The amplifier is electrically connected to the capacitance, in particular to the terminal node of the capacitance, i.e. the FD node. In particular, an input terminal of the amplifier is electrically connected to the terminal node of the capacitance. The amplifier is configured to generate, based on the respective charge signal and on the sensitivity mode, a respective amplified signal. The amplified signal is one of a low sensitivity signal and a high sensitivity signal, respectively. The low sensitivity signal and the high sensitivity signal are based on a common noise level. This can mean that the noise levels of the low sensitivity signal and the high sensitivity signal are correlated. The common noise level can be a common noise level in the spatial or temporal domain. In particular, the common noise level can be a reset noise level.

The high sensitivity signal may be called high conversion gain (HCG) signal. The low sensitivity signal may be called low conversion gain (LCG) signal.

The amplifier may form a common-drain amplifier, also known as source follower. A gate terminal of the source follower is connected to the FD node and serves as input terminal of the amplifier. A common terminal may be connected to the supply voltage. The respective amplified signal is generated at an output terminal of the amplifier. The amplifier may be used as voltage buffer. The amplifier may be configured to buffer the signal, thus to decouple the FD node from further pixel components. The amplifier may further be configured to amplify the light-induced charge carriers.

The amplified signal may either be the low sensitivity signal or the high sensitivity signal, depending on the respective sensitivity mode in which the pixel is operating in the respective instant of time. The low sensitivity signal is based on a video signal and a noise level. The noise level comprises temporal noise, such as thermal and reset noise, and fixed-pattern noise (FPN). FPN refers to the variation in the signals from pixel to pixel, which is "fixed" at a certain spatial position. Thermal noise is mainly generated by random thermally agitated motion of electrons inside an electrical conductor. Reset noise refers to the reset operation for the FD node that needs to be reset every frame before the charge integration starts. This reset operation introduces a sampling noise.

According to an aspect of the disclosure, the high sensitivity signal may be based on the low sensitivity signal. Thus, the high sensitivity signal is based on a same noise level as the low sensitivity signal, in particular on a common reset noise level and/or a common fixed-pattern noise level. The high sensitivity signal may comprise the low sensitivity signal and an additional video signal. In other words, the noise of the high sensitivity signal and the noise of the low sensitivity signal are correlated. Thus, it is possible to use the low sensitivity signal as reference level of the high sensitivity signal, such that the noise of the high sensitivity signal can effectively be canceled. This operation may be referred to as correlated double sampling (CDS). Thus, the high sensitivity signal can be accessed with CDS, such that a pure video signal is obtained.

The pixel arrangement further comprises a first capacitor, which is configured to store the high sensitivity signal. The first capacitor may be implemented as metal-oxide-semiconductor (MOS) capacitor. Alternatively, the first capacitor is formed as metal-insulator-metal (MIM) capacitor. The first capacitor comprises a terminal node and a further terminal node. The further terminal node may be grounded or connected to a further supply voltage.

The pixel arrangement further comprises a second capacitor, which is configured to store the low sensitivity signal. The second capacitor may be implemented as MOS or MIM capacitor. The second capacitor comprises a terminal node and further terminal node. The further terminal node may be grounded or connected to the further supply voltage.

The pixel arrangement further comprises a first switch arranged between the output terminal of the amplifier and the first capacitor. This can mean that the first switch connects the terminal node of the first capacitor to the output terminal of the amplifier. The first switch is provided for transferring the respective amplified signal to the first capacitor. The first switch may be formed by a first switching transistor. The first switching transistor may comprise a gate terminal configured to receive a first switch signal by which the first switching transistor becomes conductive, such that the amplified signal is transferred. A first terminal of the first switching transistor is connected to the output terminal of the amplifier. A second terminal of the first switching transistor is connected to the terminal node of the first capacitor.

The pixel arrangement further comprises a second switch arranged between the output terminal of the amplifier and the second capacitor. This can mean that the second switch connects the terminal node of the second capacitor to the output terminal of the amplifier. The second switch is provided for transferring the respective amplified signal to the second capacitor. The second switch may be formed by a second switching transistor. The second switching transistor may comprise a gate terminal configured to receive a second switch signal by which the second switching transistor becomes conductive, such that the amplified signal is transferred. A first terminal of the second switching transistor may be connected to the output terminal of the amplifier or to the second terminal of the first switching transistor. A second terminal of the second switching transistor is connected to the terminal node of the second capacitor.

Only two capacitors are needed to realize the described functions of the pixel arrangement. This allows the pixel arrangement to be small. This means that the pixel pitch can scale in size while including HDR, which in turn enables a reduction of cost and module size. For example, if the pixel is arranged in a matrix, the pixel pitch can be less than 2 µm. In addition, the proposed pixel arrangement is compatible with many HDR techniques. Advantageously, the two capacitors store two different signals, namely a high sensitivity signal and a low sensitivity signal. Thus, the dynamic range of the pixel arrangement can be increased. Further, both the high sensitivity signal and the low sensitivity signal may be based on a common noise level, consisting in particular of thermal noise and reset noise. Thus, the low sensitivity signal can be used as reference level for the high sensitivity signal. This means that the high sensitivity signal can be accessed with CDS. Since the high sensitivity signal is used in low light conditions, thermal noise is a relevant parameter. Advantageously, the thermal and reset noise can effectively suppressed by CDS. In high light conditions, the low sensitivity signal is further processed. Here, thermal noise is less relevant, since photon shot noise dominates at high illumination levels.

In at least one further embodiment, the high sensitivity signal comprises the low sensitivity signal and an additional video signal. This can mean that the high sensitivity signal equals the low sensitivity signal plus the additional video signal. The additional video signal may represent a pure video signal without noise. Advantageously, the noise of the high sensitivity signal is correlated with the noise of the low sensitivity signal, such that CDS can be performed. Thus, the noise of the high sensitivity signal can effectively be canceled.

In at least one further embodiment, the pixel arrangement further comprises at least one further amplifier. The further amplifier comprises an input terminal which is electrically connected to the first and/or the second capacitor, i.e. to the terminal node of the respective capacitor. The further amplifier is configured to generate a pixel output signal at an output terminal of the further amplifier.

The further amplifier may form a further common-drain amplifier, i.e. a further source follower. A gate terminal of the further amplifier is connected to the terminal node of the first and/or the second capacitor. This can mean that the first and second capacitor are arranged in parallel, such that the gate terminal of the further amplifier can be connected to both terminal nodes. Alternatively, the further amplifier is connected to the terminal node of the first capacitor and a second further amplifier is connected to the terminal node of the second capacitor. It is also possible that the first and the second capacitor are arranged cascaded, such that the further amplifier is only directly connected to the terminal node of the second capacitor. A common terminal of the further amplifier is connected to the pixel supply voltage. The pixel output signal is applied at an output terminal of the further amplifier. The further amplifier may be used as voltage buffer. The amplifier may be configured to buffer the signal, thus to decouple the capacitor stage from the readout circuitry.

In at least one further embodiment, the pixel arrangement further comprises a select gate between the output terminal of the further amplifier and a column bus. The select gate is provided for transferring the pixel output signal to the column bus.

The select gate may be implemented as select switch. For example, the select gate is part of a select transistor comprising a first terminal connected to the output terminal of the further amplifier and a second terminal connected to the column bus. By applying a select signal to the select gate the select transistor becomes conductive, such that the pixel output signal is forwarded via the column bus to the readout circuitry. For example, the readout circuitry comprises an analog-to-digital converter (ADC) with a sample and hold functionality. The column bus may or may not comprised by the pixel arrangement. Alternatively, only a portion of the column bus is comprised by the pixel. Advantageously, the output signal of each pixel within an array can be accessed separately.

In at least one further embodiment, the pixel further comprises a precharge gate electrically coupled to the output terminal of the amplifier. The precharge gate is configured to precharge the first capacitor and the second capacitor.

The precharge gate may be implemented as precharge switch. For example, the precharge gate is part of a precharge transistor comprising a first terminal connected to the output terminal of the amplifier and a second terminal connected to ground (GND). By applying a precharge signal to the precharge gate the precharge transistor becomes conductive, such that the first and the second capacitor can be precharged. This can in particular mean that the first and the second capacitor are discharged in each frame before they are recharged by the amplifier to their final value. Besides, the precharge transistor can also deliver a certain bias current to bias the amplifier. The precharge gate can also be implemented as constant current source configured to provide a fixed current.

In at least one further embodiment, the at least one photodiode comprises a first photodiode for generating a first charge signal in the high sensitivity mode. Further, the at least one photodiode comprises a second photodiode for generating a second charge signal in the low sensitivity mode.

The first photodiode and the second photodiode can be different. For example, the first photodiode has a larger photoactive area than the second photodiode in order to generate more charge carriers than the second photodiode. Alternatively, the second photodiode is provided with a filter in order to attenuate the second charge signal. The first and second photodiodes can share a common FD node, i.e. the same capacitance.

Accordingly, the two photodiodes can be assigned to two respective transfer gates, wherein a first transfer gate is provided for transferring the first charge signal to the terminal node of the capacitance and a second transfer gate is provided for transferring the second charge signal to the terminal node of the capacitance.

The first charge signal of the first photodiode results in the high sensitivity signal, while the second charge signal of the second photodiode results in the low sensitivity signal. Thus, by providing a first photodiode and a second photodiode that is different from the second photodiode, the respective charge signals can be used to obtain a high dynamic range.

In at least one further embodiment, the pixel arrangement further comprises a sensitivity gate. The sensitivity gate is arranged between the reset gate and the terminal node of the capacitance. In this embodiment the pixel arrangement further comprises a third capacitor comprising a terminal node. The sensitivity gate is provided for shorting the terminal node of the capacitance to the terminal node of the third capacitor.

The sensitivity gate may be implemented as gain switch. The sensitivity gate may be part of a sensitivity transistor comprising a first terminal electrically connected to the terminal node of the capacitance and a second terminal electrically connected to the terminal node of the third capacitor. By applying a gain signal to the sensitivity gate the sensitivity transistor becomes conductive, such that the FD node is shorted with the terminal node of the third capacitor. The sensitivity transistor may be called dual conversion gain (DCG) transistor and the sensitivity signal may be called DCG signal or coupling signal.

The third capacitor may be implemented as MOS or MIM capacitor. The terminal node of the third capacitor is arranged between the reset gate and the sensitivity gate.

The third capacitor further comprises a further terminal node that may be grounded.

By shorting the FD node with the terminal node of the third capacitor a combined capacitance is larger than that of the FD capacitance. Keeping the charge constant, this leads to a reduced voltage signal. Thus, by enlarging the capacitance the gain is reduced. This means that the pixel arrangement has a reduced gain if the capacitance and the third capacitor are shorted. In other words, the pixel arrangement has an increased gain if the third capacitor is electrically decoupled from the capacitance by the sensitivity gate.

In general, if the transfer gate is deactivated the photodiode is separated from the capacitance by a potential barrier. Similarly, if the sensitivity gate is deactivated the capacitance is separated from the third capacitor by a further potential barrier. This means that charge carriers are prevented from diffusing between the photodiode and the capacitance, or between the capacitance and the third capacitor, respectively. In some embodiments, however, such charge overflow is allowed, especially if the potential well of the photodiode or the potential well of the capacitance, respectively, is saturated. In this way, no photo-induced charge carriers are lost even during saturation, providing the pixel arrangement with an increased dynamic range. In other words, the third capacitor stores excess charge carriers. Furthermore, the photodiode and/or the capacitance can be dimensioned smaller.

In at least one further embodiment, the first capacitor and the second capacitor are arranged in parallel. Both the first and the second switch are electrically connected directly to the output terminal of the amplifier. The terminal node of the first capacitor may be electrically connected to the further amplifier. The terminal node of the second capacitor may be electrically connected to a second further amplifier. It is also possible that the terminal node of the first capacitor and the terminal node of the second capacitor can be connected to a common further amplifier. Advantageously, the first capacitor and the second capacitor can be controlled independently by the first and the second switch.

In at least one further embodiment, the first capacitor and the second capacitor are arranged cascaded. In this case the second switch is electrically connected to the output terminal of the amplifier via the first switch. In other words, the second switch is arranged between the terminal node of the first capacitor and the terminal node of the second capacitor. Advantageously, fewer components are required than in the case of a parallel arrangement of the capacitors.

Furthermore, an image sensor is provided that comprises an array of pixels according to the pixel arrangement as described in one of the above embodiments. This means that all features disclosed for the pixel arrangement are also disclosed for and applicable to the image sensor and vice-versa.

Furthermore, an optoelectronic device is provided that comprises the image sensor. This means that all features disclosed for the image sensor are also disclosed for and applicable to the optoelectronic device and vice-versa.

The image sensor can be conveniently employed in optoelectronic devices, such as smart phones, tablet computers, laptops, or camera modules. For example, the camera module is configured to operate in the visible domain for photography and/or video capturing. Further, the pixel arrangement is in particular suited to be operated in global shutter mode, as the signals are stored in a pixel level memory, i.e. the first capacitor and the second capacitor. The global shutter mode is in particular suited for infrared applications, where the image sensor device further comprises a light source that is synchronized with the pixels. Thus, an optoelectronic device comprising such image sensor may also work in the infrared (IR) domain, for example for 3D imaging and/or identification purposes. Image sensors with infrared sensitivity can be used in dark environments where video feed is required. Such applications reach from mobile phone face unlock to driver monitoring systems. Both can deploy illuminators that are in the short-wave infrared (SWIR) spectrum, so that the phone user/driver is not blinded by the light that is illuminating him/her.

Furthermore, a method for operating a pixel arrangement configured to convert electromagnetic radiation in a high sensitivity mode and a low sensitivity mode, respectively, is provided. The pixel arrangement described above can preferably be employed for the method for operating the pixel arrangement described herein. This means that all features disclosed for the pixel arrangement and the image sensor are also disclosed for the method for operating the pixel arrangement and vice-versa.

According to at least one embodiment of the method for operating the pixel arrangement, the method comprises converting electromagnetic radiation into a respective charge signal by at least one photodiode. The method further comprises providing a reset signal for resetting a capacitance. For example, the reset signal is applied to a reset gate electrically coupled to the capacitance. For example, by applying the reset signal a pixel supply voltage is applied to a terminal node of the capacitance, such that charge carriers stored on the capacitance are removed.

The method further comprises providing a transfer signal for transferring the respective charge signal from the at least one photodiode to the capacitance. For example, the transfer signal is applied to a transfer gate between the photodiode and the terminal node of the capacitance.

The method further comprises generating, based on the respective charge signal and the sensitivity mode, a respective amplified signal. The respective amplified signal is one of a low sensitivity signal and a high sensitivity signal, respectively. The low sensitivity signal and the high sensitivity signal are based on a common noise level. This can mean that the noise level of the low sensitivity signal is correlated with the noise level of the high sensitivity signal.

For example, the respective amplified signal is generated by an amplifier electrically connected at its input terminal to the capacitance.

The method further comprises providing a first switch signal for transferring the respective amplified signal to a first capacitor. The first capacitor is configured to store the high sensitivity signal. For example, the first switch signal is applied to a first switch between a terminal node of the first capacitor and an output terminal of the amplifier.

The method further comprises providing a second switch signal for transferring the respective amplified signal to a second capacitor. The second capacitor is configured to store the low sensitivity signal. For example, the second switch signal is applied to a second switch between a terminal node of the second capacitor and the output terminal of the amplifier.

Advantageously, the two capacitors store two different signals, which are a high sensitivity signal and a low sensitivity signal. Thus, the dynamic range of the pixel arrangement can be increased. Further, the low sensitivity signal can be used as reference level for the high sensitivity signal, as both signals are based on a common noise level. This means that the high sensitivity signal can be accessed with CDS, such that for example the thermal and reset noise can effectively canceled.

In at least one further embodiment of the method, the method further comprises a first step during pixel exposure, in which the pixel is operated in the low sensitivity mode. In low sensitivity mode the low sensitivity signal is generated and stored on the second capacitor. In a second step during pixel exposure the pixel is operated in the high sensitivity mode, such that the high sensitivity signal is generated and stored on the first capacitor. The pixel exposure refers to a time period during which the photodiode is exposed to light.

The low sensitivity signal is smaller than the high sensitivity signal. In particular, the high sensitivity signal equals the low sensitivity signal plus an additional video signal. Thus, the low sensitivity signal is determined prior to the high sensitivity signal. Thus, advantageously, the high sensitivity signal can be based on the low sensitivity signal.

In at least one further embodiment of the method, the first step and the second step during pixel exposure are conducted without resetting the capacitance in between. If the capacitance was reset, the high sensitivity signal would not be based on the low sensitivity signal, since the information about the low sensitivity signal would be removed from the FD node. Advantageously, the capacitance stores the information about the low sensitivity signal, such that it can be reused in the high sensitivity mode. Advantageously, no additional noise is introduced.

In at least one further embodiment of the method, the low sensitivity signal is read out in a first step during pixel readout. In a second step during readout the high sensitivity signal is read out. The pixel readout refers to a time period during which the analog signals stored on the capacitors are further processed. For example, the analog signals are transferred via a column bus to a readout circuitry, where they are converted into digital signals. Advantageously, the low sensitivity signal is read out prior to the high sensitivity signal, such that the low sensitivity signal can be used as reference level for the high sensitivity signal.

Reading out the high sensitivity signal can mean that the high sensitivity signal is read out directly from the first capacitor. However, it can also mean that an attenuated version of the high sensitivity signal is read out. If the first and the second capacitor are arranged cascaded, the two capacitors are coupled to each other. For example, when reading out the high sensitivity signal, the high sensitivity signal may be redistributed in the first and the second capacitor. This means that charges on the first capacitor will be mixed with charges on the second capacitor. Thus, the high sensitivity signal on the first capacitor will be attenuated, for example by a factor of two if the first capacitor is equal to the second capacitor.

In at least one further embodiment of the method, the capacitance is reset and a reset level is read out in a third step during pixel readout. Resetting the capacitance is performed by applying the reset signal. The reset level refers to a non-video signal of the pixel arrangement, i.e. without a charge signal from the photodiode. By resetting the capacitance, i.e. the FD node, additional noise is introduced that is not correlated with the noise of the high or the low sensitivity signal. However, the reset level of the pixel arrangement comprises information about fixed pattern noise (FPN). Thus, advantageously, the FPN of the pixel arrangement can be determined in the third step during pixel readout.

In at least one further embodiment, the method further comprises, during pixel readout, performing double delta sampling by using the reset level as a reference level for the low sensitivity signal. The low sensitivity signal is further processed in case of high illuminance. Here, thermal noise is less relevant since at high illuminance photon shot noise is dominant. Thus, correlated double sampling to remove the noise from the video signal is not necessary. However, it might be desired to remove the FPN from the video signal. By performing double delta sampling (DDS), i.e. by using the reset level as a reference level for the low sensitivity signal, the FPN can be removed.

In at least one further embodiment, the method further comprises, during pixel readout, performing correlated double sampling by using the low sensitivity signal as a reference level for the high sensitivity signal. As mentioned above, the low sensitivity signal and the high sensitivity signal are based on a common noise level. Thus, by performing correlated double sampling, i.e. by using the low sensitivity signal as a reference level for the high sensitivity signal, the noise can effectively be removed from the high sensitivity signal. The removed noise includes both temporal noise as well as fixed pattern noise.

In at least one further embodiment, the method further comprises, during pixel readout, determining based on respective amplitude levels, whether to use the low sensitivity signal or the high sensitivity signal for further processing. In case of high illuminance, the high sensitivity signal might be saturated. Thus, the low sensitivity signal should be used for further processing. In case of low illuminance, the low sensitivity signal might be weak and affected by noise. Thus, the high sensitivity signal should be used for further processing. Determining, based on respective amplitude levels, whether to use the low sensitivity signal or the high sensitivity signal for further processing, may comprise comparing the respective amplitude levels to respective threshold values. Advantageously, either the low sensitivity signal or the high sensitivity signal can be used depending on the current illuminance. Thus, the dynamic range is increased.

In at least one further embodiment, the method further comprises, during pixel exposure in the low sensitivity mode, adjusting a conversion gain by applying a gain signal for shorting the terminal node of the capacitance with a terminal node of a third capacitor. For example, the gain signal is applied to a sensitivity gate between the terminal node of the capacitance and the terminal node of the third capacitor. By shorting the respective terminal nodes at a given charge signal, a total capacitance is increased, which in turn decreases the voltage signal. Thus, the conversion gain for the respective charge signal is decreased. Thus, two different conversion gains can be provided.

In at least one further embodiment of the method, converting electromagnetic radiation into a respective charge signal comprises generating a first charge signal in the high sensitivity mode by a first photodiode, and generating a second charge signal in the low sensitivity mode by a second photodiode. In particular, the first photodiode and the second photodiode can be different, such that they generate different charge signals at a given illuminance. For example, a large photodiode can be used in the high sensitivity mode for generating an increased charge signal, while a smaller photodiode can be used in the low sensitivity mode for generating a reduced charge signal and thus preventing saturation of a storage element within the pixel. By using two or at least two photodiodes the dynamic range of the pixel arrangement can be increased.

In at least one further embodiment of the method, converting electromagnetic radiation into a respective charge signal comprises generating a first charge signal in the low sensitivity mode by a reduced exposure time, and generating a second charge signal in the high sensitivity mode by an increased exposure time. The respective charge signals at a given illuminance can be varied by different exposure times. For example, a long exposure time can be used in the high sensitivity mode for generating an increased charge signal, while a short exposure time can be used in the low sensitivity mode for generating a reduced charge signal and thus preventing saturation. By using two or at least two exposure times the dynamic range of the pixel arrangement can be increased.

Further embodiments of the method become apparent to the skilled reader from the embodiments of the pixel arrangement described above, and vice versa.

Furthermore, another method for operating the pixel arrangement is provided. The pixel arrangement configured to convert electromagnetic radiation in a high sensitivity mode and a low sensitivity mode described above can also be used for this method of operating. This means that all features disclosed for the pixel arrangement and the image sensor are also disclosed for the following method of operating the pixel arrangement and vice-versa. Further, aspects of the method above are also relevant for the following method. Thus, embodiments of the above method are also disclosed for and applicable to the following method.

In at least one embodiment, the method comprises accumulating charge carriers with a photodiode in a first integration period. The method further comprises pulsing, at an end of the first integration period, a transfer gate to a first voltage level to transfer a portion of the accumulated charge carriers to a capacitance, wherein said portion is configured to be drained to a supply voltage.

The first integration period is part of an exposure period. This can mean, that the exposure period is subdivided into several integration periods, for example a first integration period, a second integration period and a third integration period. The exposure period may be referred to as during pixel exposure. As mentioned above, the capacitance may be a (parasitic) capacitance of a diffusion node. Thus, in other words, the accumulated charge carriers are transferred to the diffusion node by applying a transfer signal to the transfer gate. The transfer gate may be implemented as part of a transfer transistor. The first voltage level may be a voltage level below a threshold voltage of the transfer transistor. This can mean that the first voltage level is a partial voltage level. For example, the first voltage level is 0.8 V. By applying the first voltage level to the transfer gate, a potential barrier between the photodiode and the diffusion node is lowered. Thus, excess charge carriers may overcome the lowered potential barrier to be transferred from the photodiode to the diffusion node. These excess charge carriers are referred to as said portion of the accumulated charge carriers. Said portion is configured to be drained to the supply voltage. This can be achieved by resetting the diffusion node. Resetting the diffusion node can be realized, as mentioned above, by applying a reset signal to a reset transistor that is connected between the diffusion node and a pixel supply terminal. Draining of said portion may be conducted during the exposure period or at the end of the exposure period or after the exposure period, for example.

In at least one embodiment, the method further comprises continuing to accumulate, in a second integration period, charge carriers with the photodiode.

The second integration period is part of the exposure period. The second integration period is later than the first integration period. The second integration period may immediately follow the first integration period. The exposure period may comprise the first and the second integration periods. The charge carriers accumulated at the photodiode after the second integration period comprise the charge carriers accumulated during the first and the second integration periods minus the portion of charge carriers to be drained.

In at least one embodiment, at an end of the second integration period, the method further comprises pulsing the transfer transistor to the first voltage level for transferring a first part of the accumulated charge carriers to the capacitance and storing a low sensitivity signal representing the first part of the accumulated charge carriers on at least a second capacitor (80) of a pair of capacitors electrically coupled to the capacitance.

Storing the low sensitivity signal may be conducted during a storage period. The storage period may overlap the exposure period. This can mean that the storage period starts during the exposure period. The storage period may be referred to as during frame storage of the pixel. Transferring the first part of accumulated charge carriers may be conducted after resetting the diffusion node/the capacitance for draining the portion of accumulated charge carriers. The first part of accumulated charge carriers is different from the portion of accumulated charge carriers. However, since the first voltage level is again applied to the transfer gate, the potential barrier is lowered by the same amount. Thus, the first part of accumulated charge carriers corresponds to excess charge carriers accumulated during the second integration period. The first part of accumulated charge carriers is not drained but stored on the pair of capacitors. The pair of capacitors are electrically coupled the capacitance or the diffusion node, respectively. The pair of capacitors comprise the first and the second capacitor, as mentioned above. The capacitors may be electrically coupled to the diffusion node via a source follower, as explained above. The capacitors may be arranged in parallel or cascaded, as mentioned above. In case that the capacitors are arranged cascaded, the low sensitivity signal representing the first part of the accumulated charge carriers may be distributed on both capacitors. In case that the capacitors are arranged in parallel, the low sensitivity signal may be stored on one of the capacitors instead, for example the second capacitor. Storing the low sensitivity signal may be realized by applying switch signals to respective switches assigned to the capacitors. For example, a first switch is assigned to the first capacitor, and a second switch is assigned to the second capacitor, as explained above.

In at least one embodiment, the method further comprises continuing to accumulate, in a third integration period, charge carriers with the photodiode. The third integration period is part of the exposure period. The third integration period is later than the second integration period. The third integration period may immediately follow the second integration period. The exposure period may comprise the first, the second and the third integration period. The charge carriers accumulated at the photodiode after the third integration period comprise the charge carriers accumulated during the first, the second and the third integration period minus the portion of charge carriers to be drained and minus the first part of charge carriers to be stored on at least the second capacitor.

In at least one embodiment, at end an end of the third integration period, the method further comprises pulsing the transfer transistor to a second voltage level for transferring a remaining part of the accumulated charge carriers to the capacitance and storing a high sensitivity signal representing the remaining part of the accumulated charge carriers on a first capacitor of the pair of capacitors.

Pulsing the transfer transistor to the second voltage level is conducted later than pulsing the transfer transistor to the first voltage level. The second voltage level may be a full voltage level. The second voltage level may be a voltage level above the threshold voltage level of the transfer transistor. For example, the second voltage level is 2.8 V. Thus, by applying the second voltage level the transfer transistor is in an electrically conductive state. Thus, by applying the second voltage level the potential barrier between the photodiode and the diffusion node is lower than the potential barrier when the first voltage level is applied. In particular, the potential barrier may be completely dissipated. Thus, the remaining charge carriers accumulated at the photodiode are transferred to the diffusion node. The remaining part of the accumulated charge carriers correspond to the charge carriers accumulated during the first, the second and the third integration period minus the portion of charge carriers to be drained and minus the first part of charge carriers to be stored on at least the second capacitor.

In at least one embodiment, during a readout period, the method further comprises reading out the low sensitivity signal and the high sensitivity signal stored on the capacitors.

Reading out the respective signals may be conducted by applying a select signal to a select transistor, as mentioned above. The select signal connects the capacitors with the signals stored on them to a column bus of the pixel. The capacitors may be electrically coupled to the column bus via a further source follower, as explained above.

The described method comprises barrier modulation of the transfer gate. By means of barrier modulation, the dynamic range of the pixel arrangement can be increased. In particular, the dynamic range of the pixel arrangement is increased by draining a portion of the accumulated charge carriers at high light conditions. The high sensitivity signal (high conversion gain signal, HCG signal) contains a knee point calibration value needed during linearization of the pixel output signal. In particular, knowing the duration of the first integration period and the second integration period, respectively, and the first voltage level, it is possible to reconstruct a linearized signal. The transfer transistor of each pixel is subject of variations and fluctuations in the manufacturing process. Thus, the threshold voltage of the transfer transistor differs for each pixel. This can mean that the barrier between the photodiode and the diffusion node differs for each pixel when applying the first voltage level. However, knowing the exact barrier level is relevant to remove fixed pattern noise, FPN. From the first voltage level and the HCG signal of the pixel (which corresponds to the remaining part of the accumulated charge carriers after applying the first voltage level), information about the dependence of an output signal on the barrier can be derived. Moreover, since the first voltage level that is applied during the exposure period is also applied during the storage period, the ratio of the first and second integration periods and the HCG signal can be used to determine how large the amount of charge carriers was that was drained to the supply voltage at the end of the first integration period. Given this amount and the low sensitivity signal (low conversion gain signal, LCG signal), a pixel output signal can be reconstructed that is used at high light conditions.

Further, the low sensitivity signal (LCG signal) may serve as reference level for the high sensitivity signal (HCG signal), since both signals are based on a common noise level, since the diffusion node is not reset between storing the LCG and the HCG signal. Thus, CDS can be performed for the HCG signal that is used at low light conditions (at low light conditions, the LCG signal only contains noise, but no video information).

In at least one embodiment, the method for operating a pixel arrangement comprises accumulating, in a first integration period, charge carriers with a photodiode, and pulsing, at an end of the first integration period, a transfer gate to a first voltage level to transfer a portion of the accumulated charge carriers to a capacitance, wherein said portion is configured to be drained to a supply voltage. It further comprises continuing to accumulate, in a second integration period, charge carriers with the photodiode. It further comprises, at an end of the second integration period, pulsing the transfer gate to the first voltage level for transferring a first part of the accumulated charge carriers to the capacitance, and storing a low sensitivity signal representing the first part of the accumulated charge carriers on at least a second capacitor of a pair of capacitors electrically coupled to the capacitance. It further comprises continuing to accumulate, in a third integration period (T3), charge carriers with the photodiode. It further comprises, at an end of the third integration period, pulsing the transfer gate to a second voltage level for transferring a remaining part of the accumulated charge carriers to the capacitance, and storing a high sensitivity signal representing the remaining part of the accumulated charge carriers on a first capacitor of the pair of capacitors. The method further comprises, during a readout period, reading out the low sensitivity signal and the high sensitivity signal stored on the capacitors.

In at least one embodiment, the high sensitivity signal indicates a calibration level based on the remaining part of the accumulated charge carriers.

In at least one embodiment, the method further comprises adjusting a pixel output signal based on the low sensitivity signal and the high sensitivity signal in dependence of a pixel specific knee point value that is determined based on the calibration level.

As mentioned above, the remaining part of the accumulated charge carriers corresponds to the high sensitivity signal, also called HCG signal. Knowing the first voltage level and the HCG signal, information about the transfer gate forming the barrier can be deduced. Thus, the HCG signal can be used as calibration level for the LCG signal.

This can mean that the calibration level is the HCG signal. In other words, the information about the drained portion of accumulated charge carriers is not lost, but can be reconstructed based on the first voltage level and the HCG signal and the integration periods. In this way, the drained charge carriers can be taken into account. Further, the calibration level is needed in post processing to remove FPN caused by variations in the transfer gate.

The pixel output signal may be based on the LCG signal or the HCG signal depending on the light conditions. At high light conditions, the LCG signal is further processed. Further processing of the LCG signal may mean that the LCG signal is adjusted by means of the calibration level and the relation of the first and the second integration periods. Thus, adjusting the pixel output signal may be referred to as pixel knee point calibration. The pixel knee point calibration may be performed for each pixel separately. Further, the pixel arrangement is self-calibrating, since the barrier information is contained in the HCG signal. Thus, no additional read is necessary.

Adjusting the LCG signal may further comprise a double delta sampling, DDS, routine to remove FPN.

At low light conditions, the HCG signal is further processed. Further processing of the HCG signal may mean that the HCG signal is adjusted by means of a correlated double sampling (CDS) routine.

In at least one embodiment, the first integration period is longer than the second integration period. This can mean that the duration of the first integration period is greater than the duration of the second integration period. For example, the first integration period is between 1.5 and 3.0 times as long as the second integration period. For example, the first integration period is 2.0 times as long as the second integration period. In this way, saturation effects can be avoided.

In at least one embodiment, the second voltage level is larger than the first voltage level. This means that, if the second voltage level is applied to the transfer gate, the barrier between the photodiode and the diffusion node is lower than if the first voltage level is applied to the transfer gate. Thus, the first voltage level can be a partial voltage level, while the second voltage level can be a full voltage level. In other words, the first voltage level can be below a threshold voltage level, and the second voltage level can be above a threshold voltage level. The first voltage level can be below 1.0 V, for example 0.8 V. For example, the second voltage level can be above 2.0 V, for example 2.8 V. By applying a partial voltage level to the transfer gate, only a portion of the accumulated charge carriers are transferred to the diffusion node. By applying a full voltage level the transfer gate, the photodiode can be reset and the remaining part of the accumulated charge carriers can be transferred to the diffusion node.

The described method using barrier modulation can also be combined with aspects of the method described above:

In particular, in at least one embodiment, in a first step during pixel readout (readout period) the low sensitivity signal may be read out, and in a second step during readout the high sensitivity signal may be read out, wherein in a third step during pixel readout the capacitance is reset and a reset level is read out.

In at least one further embodiment, the reset level may be used as reference level for the low sensitivity signal. This enables DDS.

In at least one further embodiment, correlated double sampling may be performed by using the low sensitivity signal as a reference level for the high sensitivity signal.

In at least one further embodiment, it may be determined based on respective amplitude levels, whether to use the low sensitivity signal or the high sensitivity signal for further processing. Thus, the pixel output signal may be adapted to the light conditions, which increases the dynamic range.

In at least one further embodiment, the pixel arrangement may comprise a dual conversion gain transistor ay explained above. Thus, the method may comprise adjusting a conversion gain by applying a gain signal for shorting the terminal node of the capacitance (corresponding to the diffusion node) with a terminal node of a third capacitor. Adjusting the conversion gain may be conducted during the storage period.

By the above described methods of operating a pixel arrangement HDR in a voltage domain global shutter (VGS) pixel can be achieved without impacting the pipeline mode, i.e. pipelining the signals to the storage capacitors. Further, only two capacitors are needed, which means that the pixel arrangement can have a low area. The latter method utilizes self-calibrating barrier modulation, which means that a calibration value is included in one of the signals, in particular in the HCG signal. Usually, a calibration value must be obtained by an additional read.

Further embodiments of the method become apparent to the skilled reader from the embodiments of the pixel arrangement described above, and vice versa. The pixel arrangement may form a voltage domain global shutter pixel. Alternatively, the pixel arrangement forms a rolling shutter pixel.

BRIEF DESCRIPTION OF THE DRAWINGS

The following description of figures may further illustrate and explain aspects of the pixel arrangement and the method of operating such pixel arrangement. Components and parts of the pixel arrangement that are functionally identical or have an identical effect are denoted by identical reference symbols. Identical or effectively identical components and parts might be described only with respect to the figures where they occur first. Their description is not necessarily repeated in successive figures.

FIG. 1 shows the dynamic range of a pixel arrangement.

FIG. 10 shows another exemplary signal timing for the pixel arrangement according to FIG. 2A.

DETAILED DESCRIPTION OF ILLUSTRATIVE EMBODIMENTS

FIG. 1 shows a photo-induced charge signal Q of a pixel arrangement 10 (not shown) plotted against an illuminance I. It can be seen that there is a linear or approximately linear relation between the charge signal Q and the illuminance I. For small values of the charge signal Q the signal is dominated by a noise floor 998 so that it is challenging to obtain a usable video signal out of the noisy charge signal Q. If the charge signal is well above the noise floor level 998 a usable video signal can be determined. However, for high charge signals Q a saturation region 999 may be reached. This means that a photodiode or a memory element in said pixel arrangement 10 can only handle a certain number of photo-induced charge carriers, as the respective potential wells are not sufficiently large to accumulate more charges. As a consequence, in a typical pixel arrangement 10 an appropriate video signal for very low light conditions and very high light conditions cannot be obtained. The light conditions in between, i.e. those light conditions for which an appropriate video signal can be obtained, define the dynamic range DR of the pixel arrangement 10. It is desired to increase the dynamic range of the pixel arrangement 10.

Figure 2A:
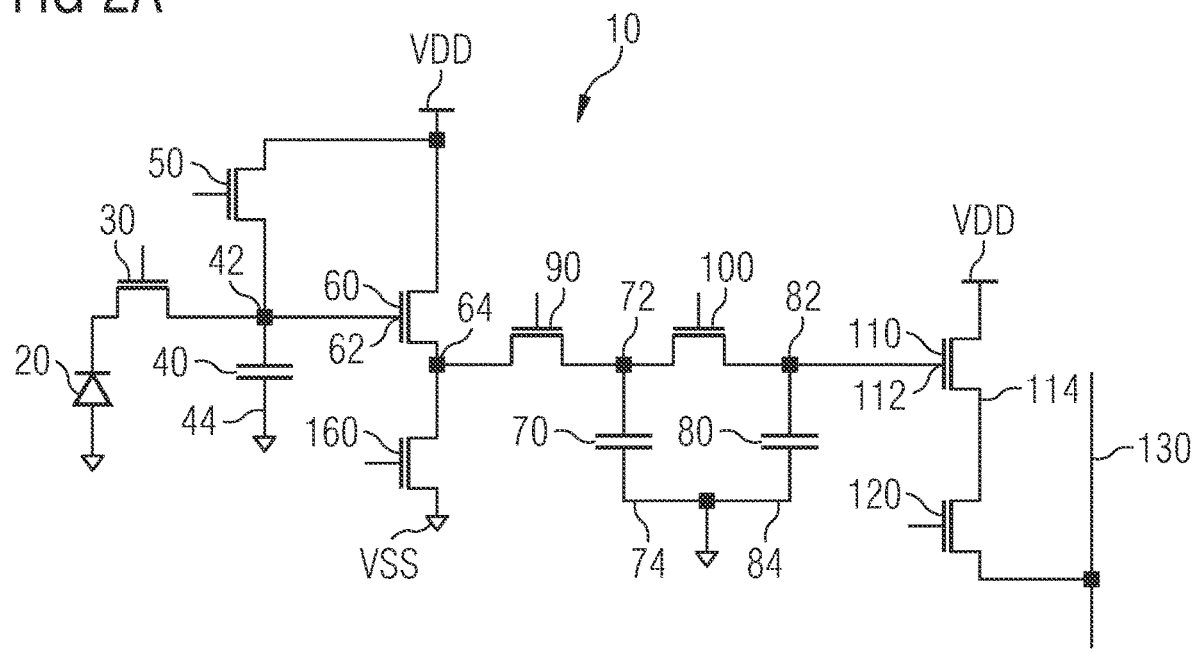
FIG. 2A shows an exemplary embodiment of a pixel arrangement.

In FIG. 2A an exemplary embodiment of a pixel arrangement 10 is shown. The shown pixel arrangement 10 can be operated to achieve a high dynamic range (HDR). The pixel arrangement 10 is configured to convert electromagnetic radiation in a high sensitivity mode and a low sensitivity mode, respectively.

The pixel arrangement 10 comprises at least one photodiode 20 configured to convert electromagnetic radiation into a respective charge signal. The photodiode 20 comprises an anode terminal and a cathode terminal. An anode terminal of the photodiode 20 is connected to a negative pixel supply voltage VSS, which can also be ground (GND). The photodiode 20 may convert light of any wavelength, for example visible light, infrared light and/or ultraviolet light.

The pixel further comprises a transfer gate 30 between the photodiode 20 and a capacitance 40. In the embodiment shown in FIG. 1 the transfer gate 30 is implemented as part of a transfer transistor, which acts as a switch. A first terminal of the transfer transistor is electrically connected to the cathode terminal of the photodiode 20. A second terminal of the transfer transistor is electrically connected to a terminal node 42 of the capacitance 40. The terminal node 42 is named (floating) diffusion (FD) node 42 in the following. The capacitance 40 may be implemented as capacitor and may be called FD capacitor. The transfer gate 30 of the transfer transistor is configured to receive a transfer signal TX for transferring the respective charge signal from the photodiode 20 to the capacitance 40. The capacitance 40 is configured to transform the respective charge signal into a respective voltage signal. A further terminal node 44 of the capacitance 40 may be connected to VSS.

The pixel arrangement 10 further comprises a reset gate 50 electrically coupled to the capacitance 40 for resetting the capacitance 40. In the embodiment shown in FIG. 1 the reset gate 50 is implemented as part of a reset transistor, which acts as a switch. A first terminal of the reset transistor is electrically connected to a pixel supply voltage VDD. A second terminal of the reset transistor is electrically connected to the terminal node 42 of the capacitance 40. The reset gate 30 of the reset transistor is configured to receive a reset signal RST for resetting the capacitance 40 by applying the pixel supply voltage VDD and therefore removing any redundant charge carrier.

The pixel arrangement 10 further comprises an amplifier 60, which is electrically connected to the capacitance 40 and configured to generate, based on the respective charge signal and on the sensitivity mode, a respective amplified signal. The respective amplified signal is a low sensitivity signal or a high sensitivity signal, respectively. The low sensitivity signal and the high sensitivity signal are based on a common noise level. The amplifier 60 may form, as shown in FIG. 2, a common-drain amplifier, also known as source follower. A gate terminal 62 of the source follower is connected to the FD node 42 and serves as input terminal 62 of the amplifier 60. A common terminal is connected to the supply voltage VDD. The respective amplified signal is generated at an output terminal 64 of the amplifier 60.

The pixel arrangement 10 further comprises a first capacitor 70 configured to store the high sensitivity signal, and a second capacitor 80 configured to store the low sensitivity signal. The first capacitor 70 comprises a terminal node 72 and a further terminal node 74. The further terminal node 74 may be connected to VSS, as shown in FIG. 1. Further, the second capacitor 80 comprises a terminal node 82 and a further terminal node 84. The further terminal node 84 may be connected to VSS, as shown in FIG. 2.

The pixel arrangement 10 further comprises a first switch 90 between the output terminal 64 of the amplifier 60 and the first capacitor 70. The first switch 90 is provided for transferring the respective amplified signal to the first capacitor 70. The first switch 90 may be formed by a first switching transistor. The first switching transistor comprises a gate terminal 90 configured to receive a first switch signal S1. A first terminal of the first switching transistor is connected to the output terminal 64 of the amplifier 60. A second terminal of the first switching transistor 90 is connected to the terminal node 71 of the first capacitor 70.

The pixel arrangement 10 further comprises a second switch 100 arranged between the output terminal 64 of the amplifier 60 and the second capacitor 80. The second switch 100 is provided for transferring the respective amplified signal to the second capacitor 80. The second switch 100 may be formed by a second switching transistor. The second switching transistor may comprise a gate terminal 100 configured to receive a second switch signal S2. A first terminal of the second switching transistor is connected to the second terminal of the first switching transistor and to the terminal node 72 of the first capacitor 70. A second terminal of the second switching transistor is connected to the terminal node 82 of the second capacitor 80.

The pixel arrangement 10 according to FIG. 2A could be operated as follows: In a first step during pixel exposure, the photodiode 20 is exposed to light for a first exposure time $T_1$, such that a first charge signal is generated and transformed into a low sensitivity signal. By applying respective switch signals S1, S2 the low sensitivity signal is transferred and stored on the second capacitor 80. In a second step during pixel exposure, the photodiode 20 is exposed to light for a second exposure time $T_2$, which is longer than the first exposure time $T_1$, such that a second charge signal is generated and transformed into a high sensitivity signal. By applying respective switch signals S1, S2 the high sensitivity signal is transferred and stored on the first capacitor 70. The floating diffusion capacitance 40 may not be reset between the first step and the second step. Thus, the high sensitivity signal is based on or comprises the low sensitivity signal. This means that both signals are based on a common noise level. Therefore, during pixel readout, the low sensitivity signal can be used as reference level for the high sensitivity signal, such that correlated double sampling (CDS) can be performed. Thus, the noise in the high sensitivity signal can be canceled.

In a further step during pixel readout, a reset level of the pixel arrangement 10 is sampled by applying a reset signal RST to the reset gate 50. The reset level can be used as reference level for the low sensitivity signal, such that double delta sampling (DDS) can be performed. Thus, the fixed pattern noise (FPN) in the low sensitivity signal can be canceled. During pixel readout, it may be determining based on the respective amplitude levels, whether to use the low sensitivity signal with DDS or the high sensitivity signal with CDS for further processing.

The pixel arrangement 10 shown in FIG. 2A comprises additional components which however can also be omitted in other embodiments. The pixel arrangement 10 according to FIG. 2A further comprises a precharge gate 160 electrically coupled to the output terminal 64 of the amplifier 60. The precharge gate 160 may be provided for precharging the first capacitor 70 and the second capacitor 80, which can in particular mean that the capacitors 70, 80 are discharged before new signals are stored. As shown in FIG. 2A, the precharge gate 160 may be part of a precharge transistor comprising a first terminal connected to the output terminal 64 of the amplifier 60 and a second terminal connected to VSS. By applying a precharge signal PC to the precharge gate 160 the precharge transistor becomes conductive, such that the first and the second capacitor 70, 80 are discharged.

The pixel arrangement 10 according to FIG. 2A further comprises a further amplifier 110, which comprises an input terminal 112 electrically connected to the second capacitor 80 and which is configured to generate a pixel output signal at an output terminal 114 of the further amplifier 110. Like the amplifier 60 the further amplifier can be implemented as source follower, where the gate 112 acts an input terminal 112 and a common terminal is connected to VDD.

The pixel arrangement 10 further comprises a select gate 120 between the output terminal 114 of the further amplifier 110 and a column bus 130 for transferring the pixel output signal to the column bus 130. As shown, the select gate 120 may be part of a select transistor comprising a first terminal connected to the output terminal 114 of the further amplifier no and a second terminal connected to the column bus 130. By applying a select signal SEL to the select gate 120 the pixel output signal is forwarded to the column bus 130.

Figure 2B:
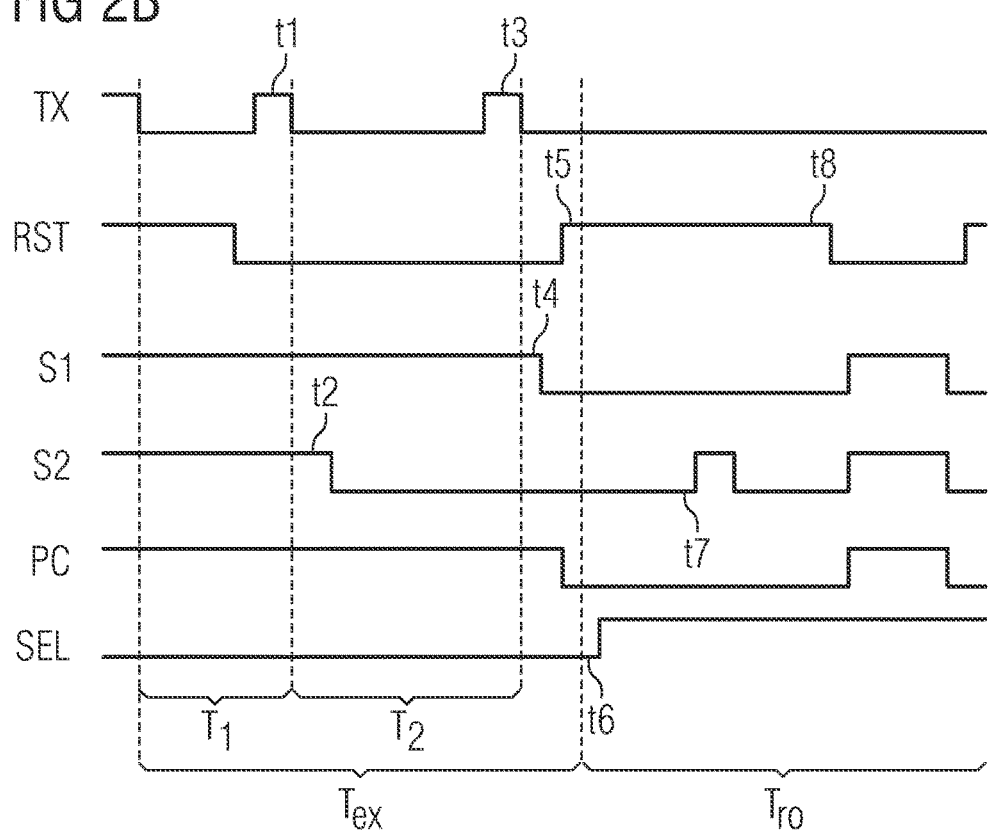
FIG. 2B shows an exemplary signal timing for the pixel arrangement according to FIG. 2A.

In FIG. 2B operating the pixel arrangement 10 according to FIG. 2A is illustrated in more detail and with respect to signal timing. However, it should be noted that the signal timing shown is more of an example and could be varied. Furthermore, the scaling of the time intervals should not be taken as an exact indication.

It can be seen that operating the pixel arrangement 10 can be divided into two time intervals, wherein the first time interval $T_{ex}$ is provided for pixel exposure and frame storage and the second time interval $T_{ro}$ is provided for pixel readout or row readout, respectively. In this context, row readout can mean readout of a single row. Rows can be read out sequentially, wherein all rows require the same time interval $T_{ro}$. As the pixel arrangement 10 can be a global shutter pixel, the pixel exposure and frame storage can be a global operation, i.e. pixel exposure and frame storage can affect each pixel of an array of pixels simultaneously. However, reading pixels can be a local operation, since the pixels or rows of a pixel array can be read one after the other. Further, in the pixel arrangement 10 of the shown embodiment the first time interval $T_{ex}$ is subdivided into a first (short) exposure time $T_1$ and second (long) exposure time $T_2$, as explained above.

FIG. 2B shows the timing of the transfer signal TX, the reset signal RST, the first switch signal S1, the second switch signal S2, the precharge signal PC and the select signal SEL. These signals can be in an activated state (high state) or in a deactivated state (low state). Applying the respective signal can mean that the signal is switched to the activated state. In the following, the timing is explained in more detail using selected points in time t1-t8 shown in the Figure.

At the end of the first exposure time $T_1$ the transfer signal TX is applied at time t1, such that the respective charge signal is transferred from the photodiode 20 to the capacitance 40. Further, this results in the low sensitivity signal that is transferred to the second capacitor 80 as both switch signals S1, S2 controlling the first and the second switch 90, 100 are in the activated state. By deactivating the second switch signal S2 at time t2 the low sensitivity signal is stored on the second capacitor 80.

At the end of the second exposure time $T_2$ the transfer signal TX is applied again at time t3, such that the respective charge signal is transferred from the photodiode 20 to the capacitance 40. In that case this results in the high sensitivity signal, which is transferred to the first capacitor 70 as the switch signal S1 is still in the activated state. By deactivating the first switch signal S1 at time t4 the high sensitivity signal is stored on the first capacitor 70. It should be noted that between time t1 and time t3 the reset signal RST remains deactivated, which means that the capacitance 40 is not reset, such that the high sensitivity signal and the low sensitivity signal are based on a common noise level. At time t5 the reset signal RST is activated. That is to prevent imaging issues such as blooming. The reset signal RST is activated after the high sensitivity signal is stored.

Pixel readout starts by applying the select signal SEL at time t6. At this instant of time the low sensitivity signal stored on the second capacitor 80 is read out. The high sensitivity signal stored on the first capacitor 70 is read out at time t7 by applying the second switch signal S2. Starting with time t8 the reset level is read out by deactivating the reset signal RST. Subsequently, the first switch signal S1, the second switch signal S2 and the precharge signal PC are activated, such that the signal corresponding to the reset level is transferred to the readout circuitry and the capacitors 70, 80 are discharged. After that the pixel arrangement 10 is ready for the next frame.

Figure 3:
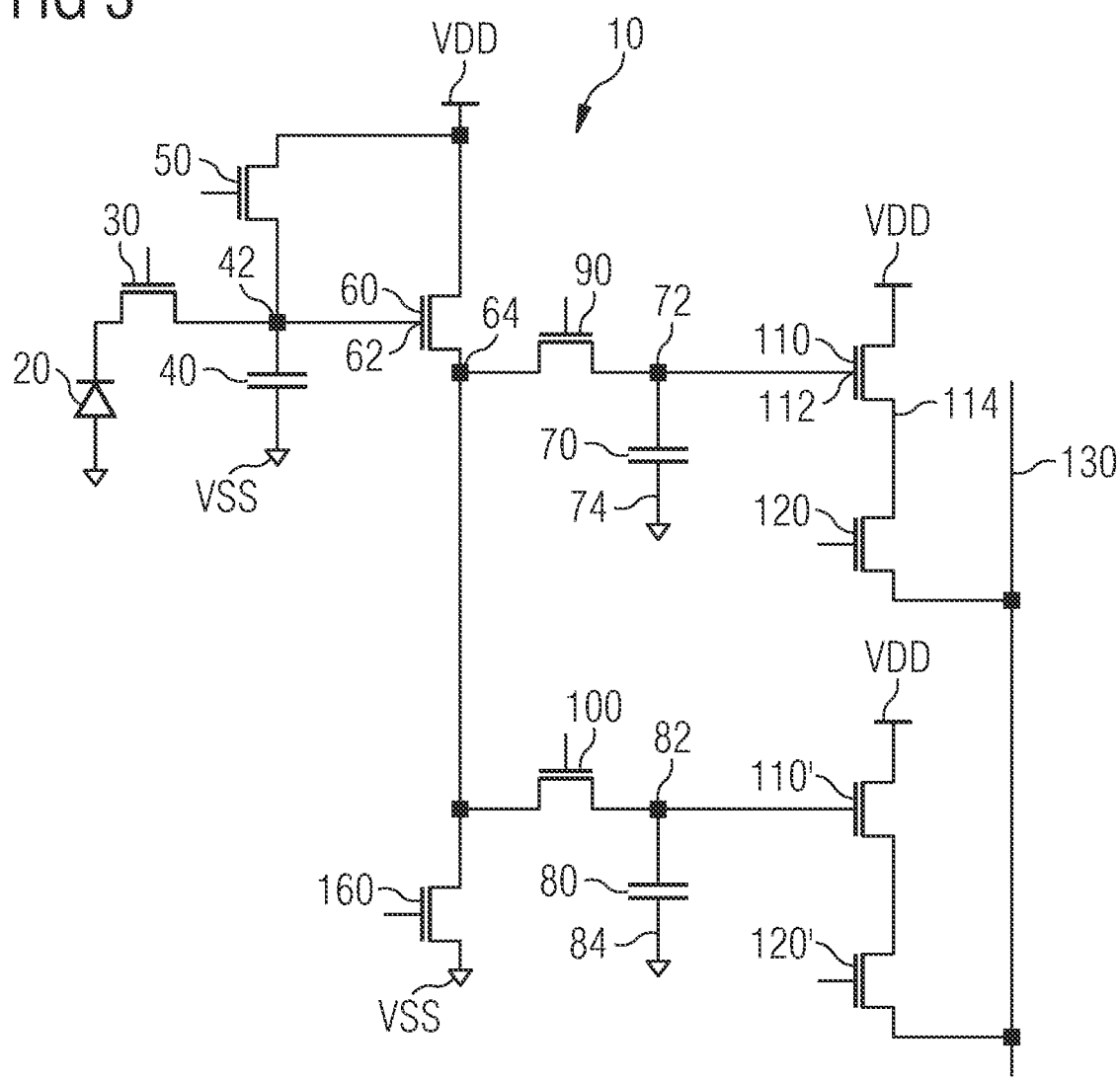
FIG. 3 shows another exemplary embodiment of a pixel arrangement.

In FIG. 3 another embodiment of the pixel arrangement 10 is shown. The embodiment according to FIG. 3 is different from the embodiment according to FIG. 2 in that the capacitors 70, 80 are not arranged cascaded, but in parallel. This means that the second switch 100, which is coupled to the second capacitor 80, is directly connected to the output terminal 64 of the amplifier 60, and not as in FIG. 2 via the first switch 90. It should be noted that the precharge gate 160 can also be implemented as constant current source configured to provide a fixed current. Further, the embodiment according to FIG. 3 further comprises a second further amplifier no' and further select gate 120' coupled to the second capacitor 80, while the further amplifier no and the select gate 120 are coupled to the first capacitor 70. It should be noted, however, that the embodiment shown illustrates a parallel arrangement of the capacitors 70, 80 by way of example only. Other arrangements are possible. For example, the parallel arranged capacitors 70, 80 could share a common further amplifier no by means of additional switches. At the expense of the need for further components, a parallel arrangement has the advantage that the high sensitivity signal and the low sensitivity signal can be stored and read independently. It will be appreciated by a skilled person how to implement a similar signal timing as shown in FIG. 2B. However, the signal timing may change slightly both during pixel exposure and pixel readout, since the first switch and the second switch can be operated independently.

Figure 4A:
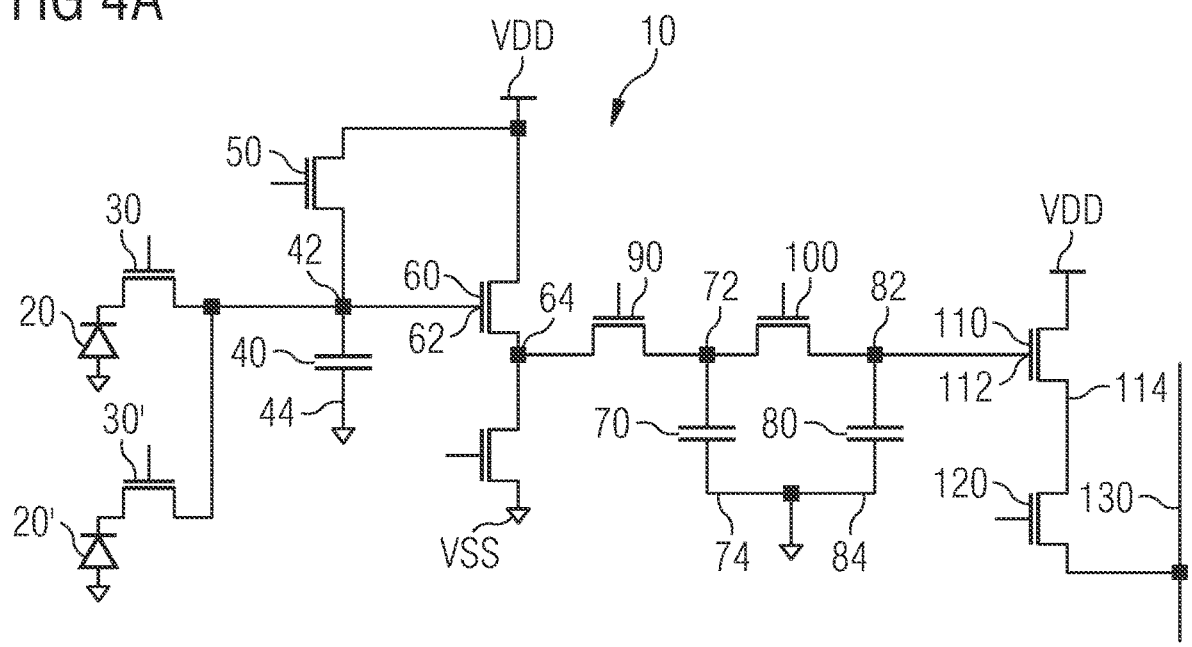
FIG. 4A shows another exemplary embodiment of a pixel arrangement.

In FIG. 4A another embodiment of the pixel arrangement 10 is shown. The embodiment according to FIG. 4 is different from the embodiment according to FIG. 2 in that the pixel arrangement further comprises a second photodiode 20', which is connected to the FD node 42 via a second transfer gate 30'. This means that the first photodiode 20 and the second photodiode 20' are arranged in parallel. The first photodiode 20 is configured to generate a first charge signal in the high sensitivity mode, and the second photodiode 20' is configured to generate a second charge signal in the low sensitivity mode. The first and the second photodiode 20, 20' can be different, which can mean that at a given illuminance the respective charge signals are different. The way of operating such pixel arrangement 10 can be similar as in the embodiment of FIG. 2A, however, the exposure times of the respective photodiodes 20, 20' can be equal.

Figure 4B:
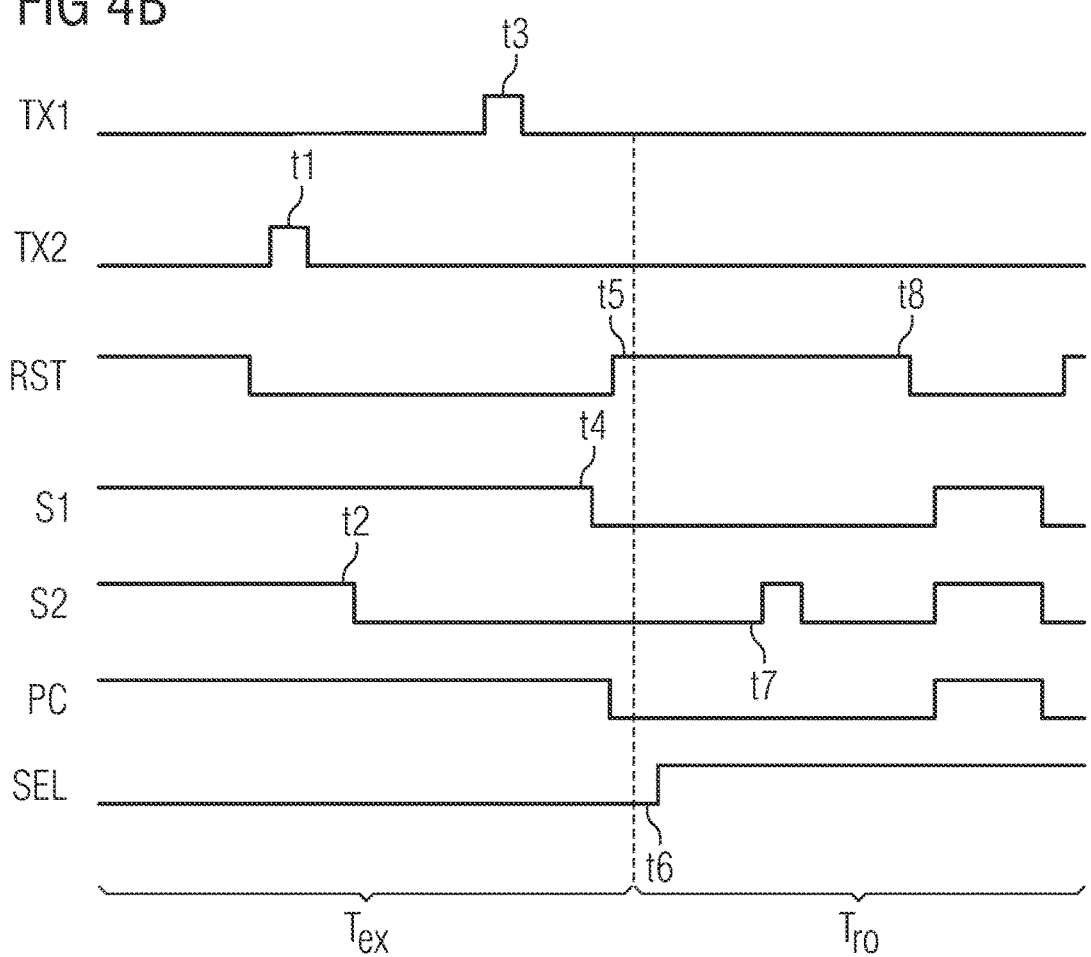
FIG. 4B shows an exemplary signal timing for the pixel arrangement according to FIG. 4A.

In FIG. 4B operating the pixel arrangement 10 according to FIG. 4A is illustrated in more detail and with respect to the signal timing. Again, it should be noted that the signal timing shown is more of an example and could be varied. The scaling of the time intervals should not be taken as an exact indication. The timing of the respective signals is similar as in the example of FIG. 2B, apart from the difference that a first transfer signal TX1 controls the first transfer gate 30 and a second transfer signal TX2 controls the second transfer gate 30'. Thus, at time t1 the respective charge signal is transferred from the second photodiode 20' to the capacitance 40 by activating the second transfer signal TX2, while at time t3 the respective charge signal is transferred from the first photodiode 20 to the capacitance 40 by activating the first transfer signal TX1. For further explanation of FIG. 4B it is referred to the above description with respect to FIG. 2B.

Figure 5:
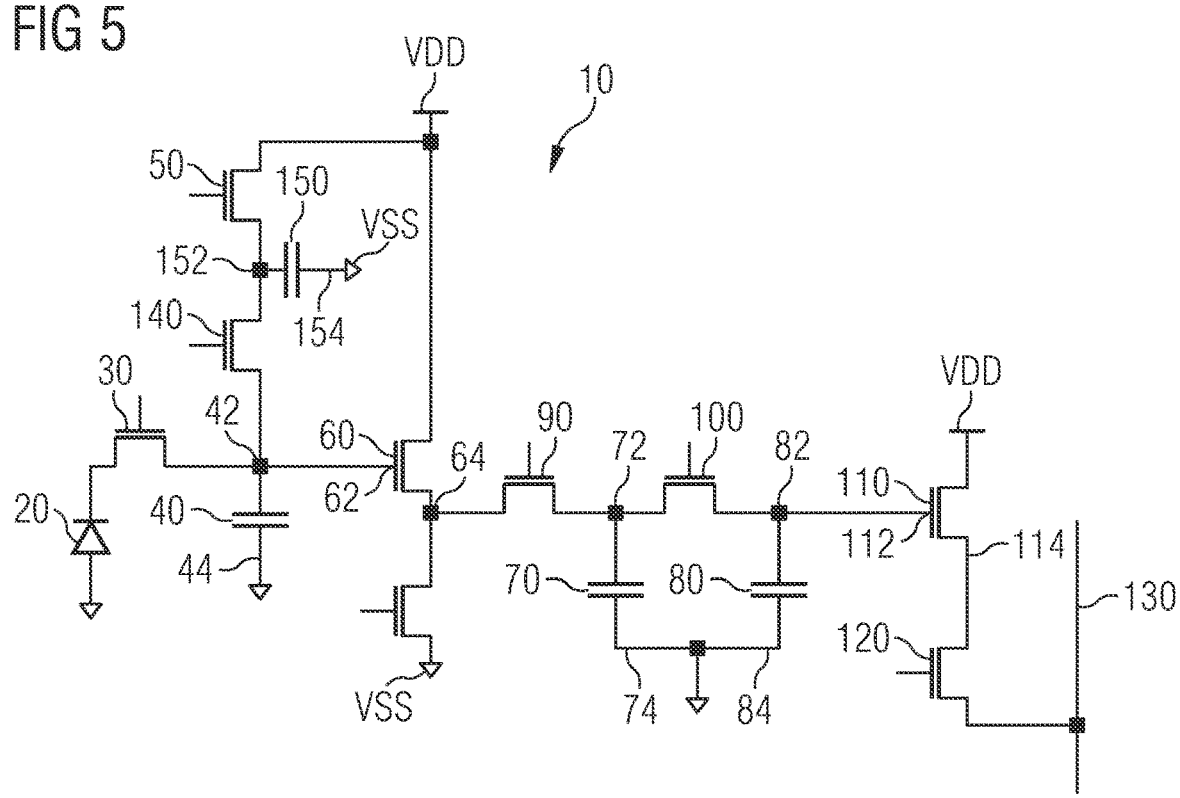
FIG. 5 shows another exemplary embodiment of a pixel arrangement.

In FIG. 5 another embodiment of the pixel arrangement 10 is shown. The embodiment according to FIG. 5 is different from the embodiment according to FIG. 2A in that it further comprises a sensitivity gate 140 between the capacitance 40 and the reset gate 50. Thus, in this embodiment, the reset gate 50 is electrically coupled to the capacitance 40 via the sensitivity gate 140. Further, the pixel arrangement 10 comprises a third capacitor 150. The third capacitor 150 comprises a terminal node 152 and a further terminal node 154. The further terminal node 154 of the third capacitor 150 may be connected to VSS, as indicated. The sensitivity gate 140 may be part of a sensitivity transistor comprising a first terminal connected to the FD node 42 of the capacitance 40 and a second terminal connected to the terminal node 152 of the third capacitor 150. By applying a gain signal to the sensitivity gate 140 the sensitivity transistor becomes conductive, such that the FD node 42 is shorted with the terminal node 152 of the third transistor 150. Thus, a total capacitance can be increased and a conversion gain can be reduced.

The operational mode of this embodiment is similar to that of the embodiment according to FIG. 2A. Here, however, the pixel 10 is not necessarily exposed twice. The charge signal of the photodiode 20 is first transformed with a low conversion gain by applying a gain signal to the sensitivity gate 140, leading to the low sensitivity signal. Then, the charge signal is transformed with a high conversion gain by deactivating the gain signal, leading to the high sensitivity signal. As in the before-mentioned embodiments, the capacitance 40 is not reset between the generation of the high and the low sensitivity signals. It will be appreciated by a skilled person how to implement a similar signal timing as shown in FIGS. 2B and 4B. However, the signal timing may change slightly, at least during pixel exposure.

Figure 6:
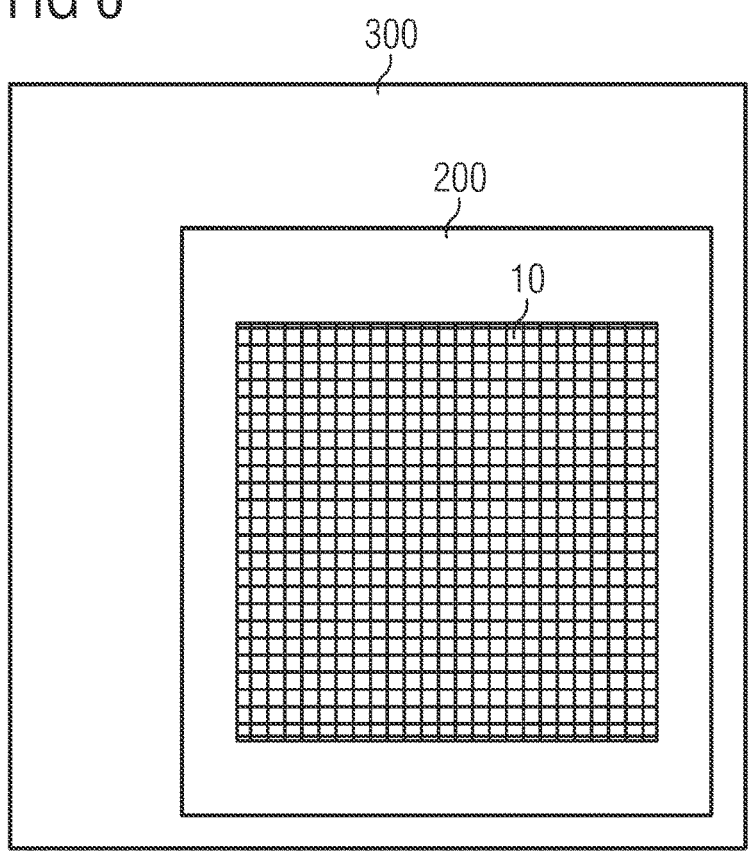
FIG. 6 shows a schematic of an optoelectronic device comprising an image sensor comprising a pixel arrangement.

In FIG. 6 an optoelectronic device 300 comprising an image sensor 200 comprising the pixel arrangement 10 is shown schematically. The pixels 10 of the image sensor 200 can be arranged in a two-dimensional array, as indicated in FIG. 6. The optoelectronic device 300 or the image sensor 200 may comprise further components, for example other circuit elements or a light source that is synchronized with the pixels 10. The pixel arrangement is used e.g. in a voltage domain global shutter pixel, abbreviated VGS pixel. The pixel arrangement 10 is implemented e.g. as a rolling shutter pixel.

Figure 7:
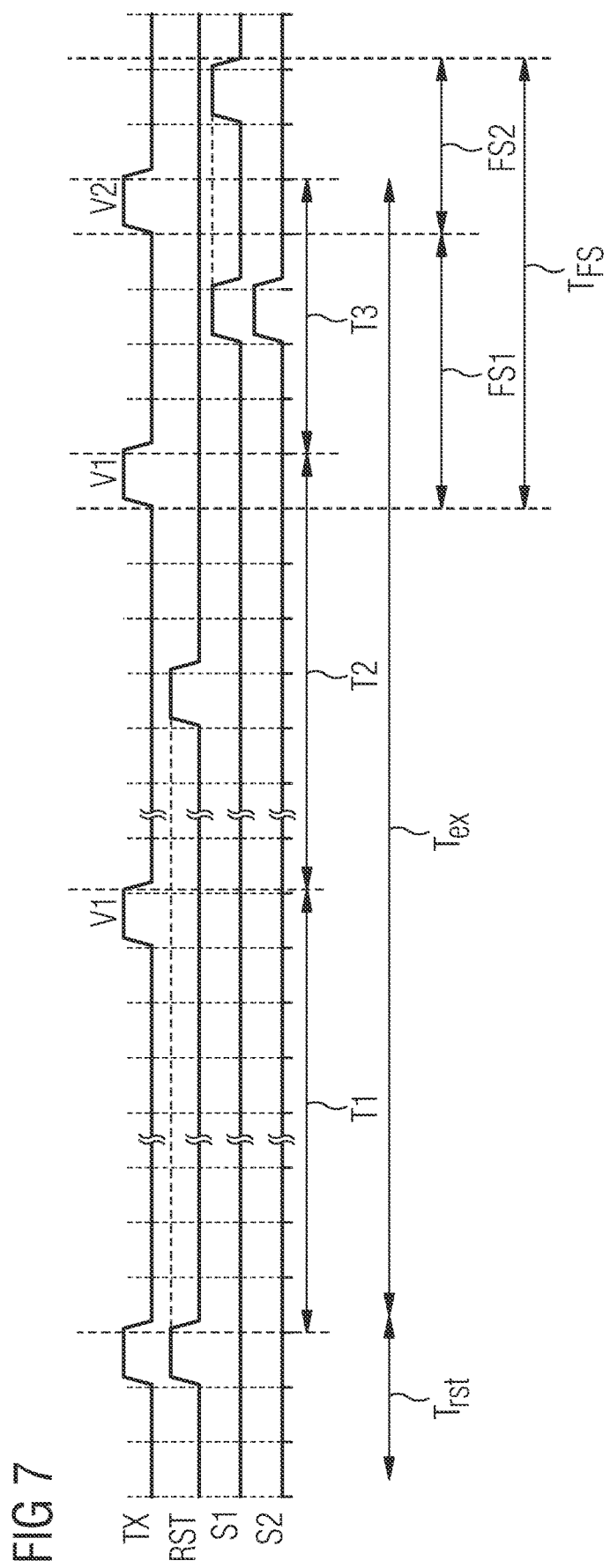
FIG. 7 shows another exemplary signal timing for the pixel arrangement according to FIG. 2A.

FIG. 7 shows another exemplary timing diagram performed by a pixel arrangement which is shown e.g. in FIG. 2A. However, with small modification the timing diagram can also be applied to the pixel arrangement 10 according to FIG. 3 (omitting the first switch signal S1). The following signals are shown as a function of time: The transfer signal TX, the reset signal RST, the first switch signal S1 and the second switch signal S2. It should be noted that the signal timing shown is more of an example and could be varied. Furthermore, the scaling of the time intervals should not be taken as an exact indication.

FIG. 7 shows a reset period $T_{rst}$, an exposure period $T_{ex}$ and a (frame) storage period $T_{FS}$. A readout period $T_{ro}$ is not shown. The readout period $T_{ro}$ would follow the storage period $T_{FS}$. The storage period $T_{FS}$ overlaps with the exposure period $T_{ex}$. The exposure period $T_{ex}$ follows the reset period $T_{rst}$.

The exposure period $T_{ex}$ includes the first and the second and the third integration periods T1, T2, T3. The third integration period follows the second integration period. The second integration period T2 follows the first integration period T1. The storage period $T_{FS}$ includes a first and a second storage phase FS1, FS2. The second storage phase FS2 follows the first storage phase FS1.

The storage period $T_{FS}$ may be a global storage period for each pixel within the pixel array. The readout period $T_{ro}$ may be performed for each row separately. Therefore, there may be a time gap between the second storage phase FS2 and the readout period $T_{ro}$.

During the reset period $T_{rst}$ a reset signal RST and a transfer signal TX is applied. This can mean that the reset gate 50 and the transfer transistor 30 are pulsed, resulting in any redundant charge carriers to be removed by connecting the photodiode 20 and the diffusion node 42 to the pixel supply voltage VDD. The transfer gate may be pulsed to a full voltage level, i.e. to the second voltage level V2. The reset signal RST may stay high until the second TX pulse to the first voltage level V1, as indicated by the dashed line.

During the first integration period T1 charge carriers are accumulated by the photodiode 20. The amount of accumulated charge carriers depends on the duration of the first integration period T1. At an end of the first integration period T1, the transfer gate 30 is pulsed to a first voltage level V1. This leads to a transfer of a portion of the accumulated charge carriers to the capacitance 40 or the diffusion node 42, respectively. Said portion is configured to be drained to the pixel supply voltage VDD. This is done via the reset signal RST, which is used to connect the diffusion node 42 to the pixel supply voltage VDD.

After said pulse of the transfer gate 30, charge carriers are continued to be accumulated in the second integration period T2 by the photodiode 20. The second integration period T2 may be shorter than the first integration period T1. The amount of accumulated charge carriers in the second integration period T2 depends on the duration of the second integration period T2.

In the shown example, a reset pulse RST is applied during the second integration period T2 to the reset gate 50. This removes any redundant charge carriers from the diffusion node 42, in particular the portion of accumulated charge carriers transferred during the V1 pulse. Thus, said portion is drained to the pixel supply voltage VDD.

At an end of the second integration period T2, the transfer gate 30 is pulsed again to the first voltage level V1. This leads to a transfer of a first part of accumulated charge carriers to the diffusion node 42. A low sensitivity signal representing said first part of the accumulated charge carriers is configured to be stored on a capacitor (70, 80), as explained below.

During the third integration period T3 charge carriers are continued to be accumulated by the photodiode 20. The amount of accumulated charge carriers depends on the duration of the third integration period T3. At an end of the third integration period T3, the transfer gate 30 is pulsed to a second voltage level V2. This leads to a transfer of a remaining part of accumulated charge carriers to the diffusion node 42. A high sensitivity signal representing the remaining part of the accumulated charge carriers is configured to be stored on a capacitor (70, 80), as explained below.

The first storage phase FS1 of the storage period $T_{FS}$ used the pulse to the first voltage level V1 that leads to the transfer of the first part of the accumulated charge carriers to the capacitance 40 or the diffusion node 42, respectively. Said first part may correspond to the charge carriers accumulated during the second integration period T2. Then, the first and the second switch signals S1, S2 are applied for storing the low sensitivity signal representing the first part of the accumulated charge carriers on the pair of capacitors 70, 80, that are electrically coupled to the capacitance 40 via the source follower 60. The low sensitivity signal may be redistributed on the first capacitor 70 and the second capacitor 80.

The second storage phase FS2 follows by using the pulse to the second voltage level V2 that leads to the transfer of the remaining part of the accumulated charge carriers to the capacitance 40 or the diffusion node 42, respectively. Said remaining part may correspond to the charge carriers accumulated during the first to third integration period T1-T3 (minus the drained portion and the first part). The second voltage level V2 may be a full voltage level, such that all remaining charge carriers are transferred. Then, the first switch signals S1 is applied to the first switch 90 for storing the high sensitivity signal representing the remaining part of the accumulated charge carriers on the first capacitor 70. Alternatively, the first switch signal S1 may stay high from the first pulse to the second pulse, as indicated by the dashed line.

Figure 8:
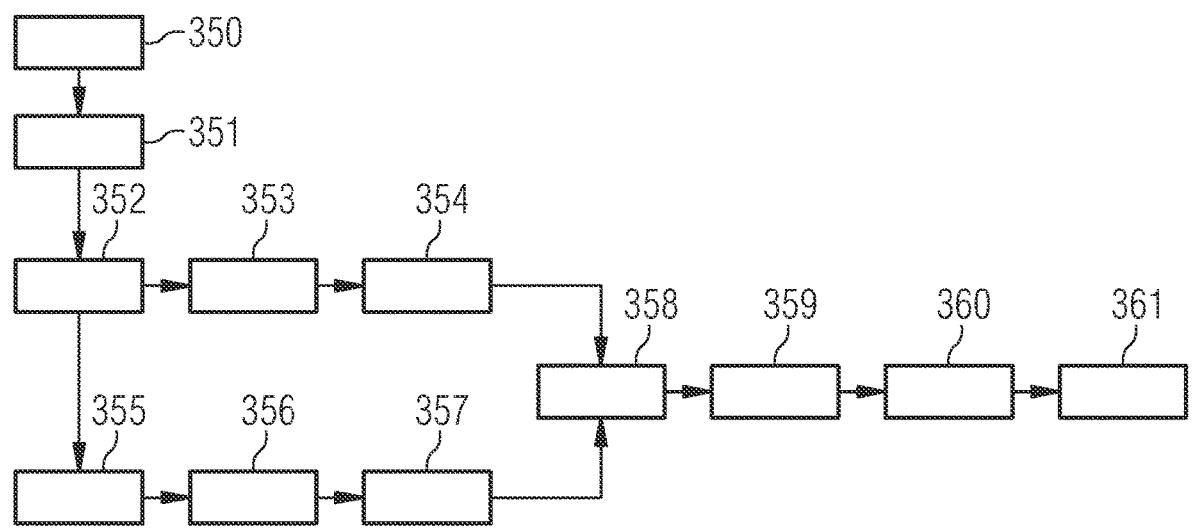
FIG. 8 shows an exemplary operation performed by the pixel arrangement according to FIG. 2A.

FIG. 8 shows an exemplary operation performed by the pixel arrangement 10 which is shown in FIG. 2A, 3 or 5. In FIG. 8 the operation is shown in blocks. A method for operating the pixel arrangement 10 comprises e.g. the following blocks which can be named procedures or steps:

Block 350: Start of exposure: Electromagnetic radiation is converted into charge carriers by the photodiode 20. This means that charge carriers are accumulated in the photodiode 20. This phase may be referred to as exposure period $T_{ex}$. The exposure period $T_{ex}$ may be subdivided into several subsequent integration periods T1 and T2. The number of integration periods may be two.

Block 351: The transfer barrier is modified based on a system input: The transfer signal TX that is provided to the transfer transistor 30 controls a barrier between the photodiode 20 and the FD node 42. At the end of a first integration period T1 the transfer gate 30 is pulsed to a first voltage level V1 of the transfer signal TX. The first voltage level V1 of the transfer signal TX is selected such that the barrier for a flow of charge carriers between the photodiode 20 and the FD node 42 is lowered. That means that a portion of the accumulated charge carriers is transferred to the FD node 42. After that, a second and a third integration period T2, T3 follow in that charge carriers are continued to be accumulated.

The portion of accumulated charge carriers is to be drained to the pixel supply voltage. Draining said portion to the pixel supply voltage can be conducted by applying the reset signal RST (and the coupling signal DCG, if applicable), such that the FD node 42 is electrically connected to the pixel supply voltage VDD.

Block 352: Transfer of the first part of the charge carriers accumulated by the photodiode 20 to the FD node 42. At the end of the second integration period T2 the transfer gate 30 is again pulsed to the first voltage level V1 of the transfer signal TX. That means that a first part of the accumulated charge carriers is transferred to the FD node 42. The first part of the charge carriers corresponds to the charge carriers accumulated in the second integration period T2. The charge carriers at the FD node 42 generate a capacitance voltage at the input 62 of the amplifier 60.

Block 353: In the first phase FS1 of the storage period $T_{FS}$, store the first part of charge carriers on the first and the second capacitor 70, 80: The first and the second switching transistors 90, 100 are set in a conducting state for transferring the first part of charge carriers to the second capacitor 80 from the FD node 42. This can mean that the amplified capacitance voltage is applied to the first and the second capacitor 70, 80. The second switch signal S2 may have a short pulse for equalizing the voltages at the first and the second capacitor 70, 80. This can mean that the signal is redistributed on the first and the second capacitor 70, 80. Said amplified capacitance voltage corresponds to the low conversion gain (LCG) signal.

Block 354: In a first phase of the readout period $T_{ro}$, readout of the second capacitor 80: An output voltage tapped at the second capacitor 80 is amplified by the further amplifier no. In case the select transistor 120 is set in a conducting state in the first readout phase of the readout period $T_{ro}$, the amplified output voltage is provided to the column line 130 for digitization. A first digitized value is generated as a function of a first value of the output voltage, e.g. by an evaluation circuit. Said first value of the output voltage corresponds to the LCG signal.

Block 355: Transfer the remaining charge carriers to the FD node 42: At the end of the third integration period T3 the transfer gate 30 is pulsed to the second voltage level V2 of the transfer signal TX. That means that a remaining part of the accumulated charge carriers is transferred to the FD node 42. Thus, the transfer gate 30 is pulsed to different voltage levels V1, V2 modifying the barrier potential.

By the pulse to the second voltage level the barrier between the photodiode 20 and the FD node 42 is minimized or removed. The first voltage level V1 of the transfer signal results in a higher barrier than the second voltage level V2. In an example, V1<V2.

Block 356: In a second phase FS2 of the storage period $T_{FS}$, store the remaining charge carriers accumulated by the photodiode 20 on the first capacitor 70. This can mean that the capacitance voltage VC that tapped at the FD node 42 is amplified by the amplifier 60. The amplified capacitance voltage is provided to the first capacitor 70 by providing a pulse of the first switch signal S1 to the first switching transistor 90. Said amplified capacitance voltage corresponds to the high conversion gain (HCG) signal.

Block 357: In a second phase RO2 of the readout period $T_{ro}$, readout of the first capacitor 70: After the output voltage at the second capacitor 80 has been readout in block 354 in the first readout phase RO1, the second switching transistor 100 is set in a conducting state. Thus, the voltages at the first capacitor 70 and at the second capacitor 80 equalize. Since the capacitance voltage is still amplified by the amplifier 60, the output voltage at the second capacitor 80 is equal to the amplified capacitance voltage. The output voltage is amplified by the further amplifier no. When the select transistor 120 is set in a conducting state in the second readout phase RO2 of the readout phase RO, the amplified output voltage is provided to the column line 130 for digitization. A second digitized value is generated as a function of a second value of the output voltage by the evaluation circuit. Said second value of the output voltage corresponds to the HCG signal.

Typically, the steps of the blocks 352, 353, 355, 356 are performed in the frame storage period $T_{FS}$. The steps of the blocks 354, 357 are performed in the readout period $T_{ro}$.

Block 358: Subtract a voltage of the second capacitor 80 or a digitized value of the voltage of the second capacitor 80 from a voltage of the first capacitor 70 or a digitized value of the voltage of the first capacitor 70: An output signal which represents an illumination IL of the photodiode 20 is a function of the first digitized value (resulting from block 353) and of the second digitized value (resulting from block 357). In an example, the first digitized value (resulting from block 353) is subtracted from the second digitized value (resulting from block 357) by an evaluation circuit. By this operation the HCG signal may be accessed with correlated double sampling (CDS), since the first (digitized) value and the second (digitized) value are based on a common noise level consisting in particular of thermal noise and reset noise. This means that the LCG signal can be used as reference level for the HCG signal. Since the HCG signal is used at low light conditions, thermal noise is a relevant parameter. Thus, the thermal and reset noise can effectively suppressed by CDS. In high light conditions, the LCG signal is further processed. Here, thermal noise is less relevant, since photon shot noise dominates.

Block 359: Gain up the LCG signal. This can mean that the LCG signal is adjusted. In particular, the LCG signal may be amplified. Adjusting or amplifying the LCG signal may be performed by an evaluation circuit. This step may in particular occur, if the pixel arrangement 10 comprises a dual conversion transistor 140 and a third capacitor 150. In that case, the LCG signal might be sampled with a lower gain to increase the dynamic range. In order to correct for this gain adjustment, the LCG signal is gained up in block 359. However, this step may be omitted, if the pixel arrangement 10 does not comprise a dual conversion gain procedure. In addition, the LCG signal may be accessed with double delta sampling (DDS). The LCG signal is used in case of high illuminance, where thermal noise is less relevant since photon shot noise is dominant. Thus, correlated double sampling to remove the noise from the video signal is not necessary. However, it might be desired to remove fixed pattern noise (FPN) from the video signal. By performing double delta sampling (DDS) FPN can be removed from the LCG signal. DDS can be performed by subtracting a reset level from the LCG signal, wherein the reset level can be readout in a third phase of the readout period $T_{ro}$ after the second readout phase.

Block 360: Per pixel knee point calibration: The HCG signal contains the first calibration level needed in post processing to remove FPN caused by variations of the transfer transistors affecting the threshold voltage. Since the same first voltage level V1 that has been applied for barrier modulation after the first integration period T1 is also applied during readout, the HCG signal comprises the knee point calibration value needed during linearization and for FPN correction. The knee point calibration is performed for each pixel separately. Block 360 is optional.

Block 361: Linearization. It is possible to reconstruct a linearized pixel output signal, i.e. a pixel output signal that linearly depends on the illumination level. Reconstructing the pixel output signal may depend on the light conditions:

In low-light situation, none of the pulses to the first voltage level V1 affects the photodiode charges. Reconstruction can be achieved by reading the HCG signal with CDS.

In high-light situation, both pulses to the first voltage level V1 affect the photodiode charges. For reconstruction, the LCD signal is used with DDS. For linearization it is multiplied with the exposure ratio T0/T1, wherein T0 denotes the total exposure time.

In mid-light situation, only the second pulse to the first voltage level V1 affects the photodiode charges. For reconstruction, the HCG signal (with CDS) and the LCG signal (with DDS) are summed in digital domain.

The voltage level V1 of the pulse for barrier modulation of the transfer transistor 30 may optionally be used to reconstruct the pixel output signal.

Figure 9:
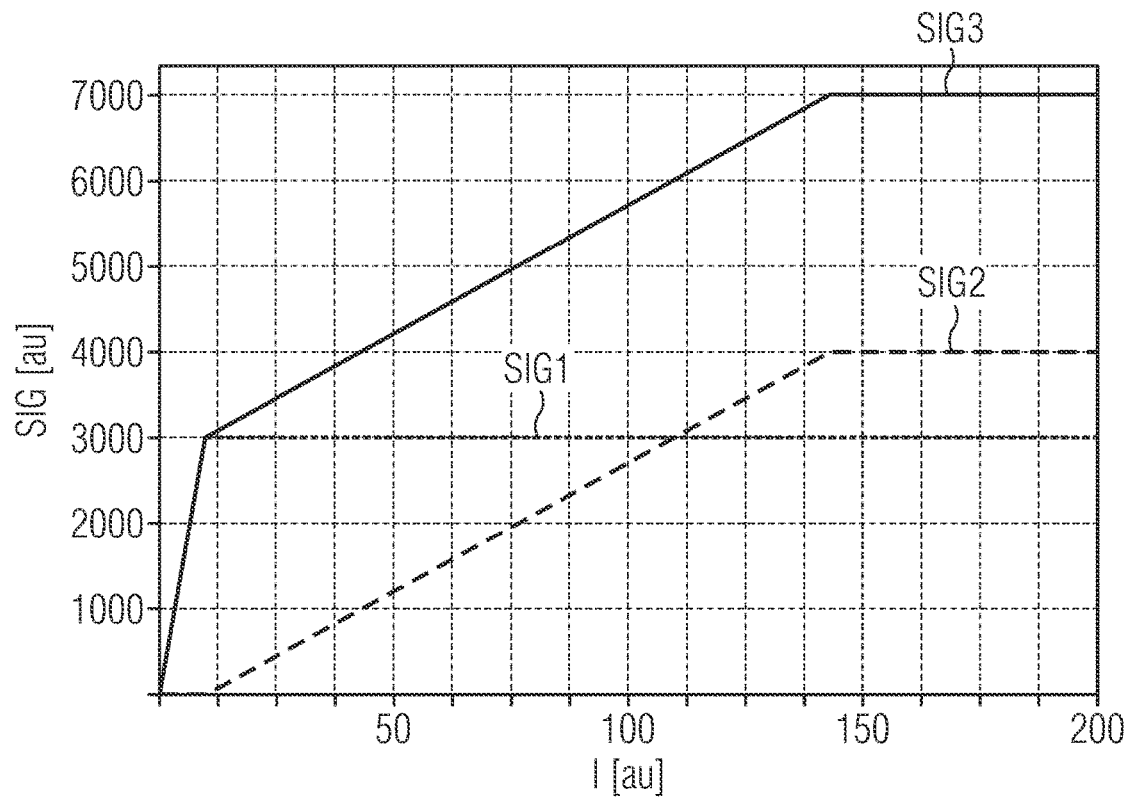
FIG. 9 shows an exemplary characteristic of a pixel arrangement.

FIG. 9 shows an exemplary characteristic of a pixel arrangement 10 which is shown e.g. in FIG. 2A and operated according to the method of FIGS. 7 and 8. A response signal SIG in artificial units is shown as a function of an illumination I in artificial units. A signal SIG1 (dotted line) is the signal resulting from the first integration period T1. It saturates for higher exposure levels as pulsing the transfer gate 30 to the first voltage level V1 leads to draining excess charge carriers to the pixel supply voltage VDD.

A signal SIG2 (dashed line) is the signal that results from the second integration period T2. The slope of signal SIG2 is less steep than the slope of signal SIG1 since the integration period T2 may be shorter than the integration period T1. Alternatively or additionally, the slope of signal SIG2 is less steep than the slope of signal SIG1 as both signals are obtained at different conversion gains. For example, the signal SIG1 (up to the knee point) is obtained at high conversion gain. For example, the signal SIG2 is obtained at low conversion gain. Thus, the slope depends e.g. on a value of the capacitance 40 and on the capacitance value of the third capacitor 150. The slope difference depends on the gain ratio. The signal SIG2 may saturate for very high illumination levels, where the size of the photodiode 20 is too small.

An output signal SIG3 (solid line) is the signal obtained by a combination of the signals SIG1 and SIG2. Further, the output signal SIG3 may be a function of the signal SIG1, the signal SIG2 and a reset signal (not shown). By combining the signals SIG1 and SIG2 the dynamic range of the pixel arrangement 10 can be increased. The exact saturation level of the signal SIG1 can be determined from the HCG signal, since the HCG signal corresponds to the remaining charge carriers after the pulse to the first voltage level V1.

FIG. 10 shows another exemplary timing diagram performed by a pixel arrangement 10 which is shown e.g. in FIG. 2A. The timing according to FIG. 10 differs from the timing according to FIG. 7 in that the exposure period is differently defined. In particular, the exposure period $T_{ex}$ does not overlap with the storage period $T_{FS}$. As shown in FIG. 7, the exposure may stop after the second integration period T2. This can mean that the exposure comprises or consists of the first and the second integration period T1, T2. A reset pulse RST is applied at the end of the second integration period T2 to remove any redundant charge carriers from the diffusion node 42, in particular the portion of accumulated charge carriers transferred during the V1 pulse.

In that embodiment, the method for operating the pixel arrangement 10 comprises, during an exposure period $T_{ex}$, accumulating, in a first integration period T1, charge carriers with a photodiode 20, pulsing, at an end of the first integration period T1, a transfer gate 30 to a first voltage level V1 to transfer a portion of the accumulated charge carriers to a capacitance 40, wherein said portion is configured to be drained to a supply voltage VDD, continuing to accumulate, in a second integration period T2, charge carriers with the photodiode 20. During a storage period $T_{FS}$:

pulsing the transfer gate 30 to the first voltage level V1 for transferring a first part of the accumulated charge carriers to the capacitance 40, storing a low sensitivity signal representing the first part of the accumulated charge carriers on a pair of capacitors 70, 80 electrically coupled to the capacitance 40, pulsing the transfer gate 30 to a second voltage level V2 for transferring a remaining part of the accumulated charge carriers to the capacitance 40, storing a high sensitivity signal representing the remaining part of the accumulated charge carriers on a first capacitor 70 of the pair of capacitors 70, 80. During a readout period $T_{ro}$: reading out the low sensitivity signal and the high sensitivity signal stored on the capacitors 70, 80.

For further details it is referred to the description of FIG. 7. Features disclosed in conjunction with FIG. 7 may also apply to the embodiment according to FIG. 10.

The embodiments of the pixel arrangement 10 and the method of operating such pixel arrangement 10 disclosed herein have been discussed for the purpose of familiarizing the reader with novel aspects of the idea. Although preferred embodiments have been shown and described, many changes, modifications, equivalents and substitutions of the disclosed concepts may be made by one having skill in the art without unnecessarily departing from the scope of the claims.

It will be appreciated that the disclosure is not limited to the disclosed embodiments and to what has been particularly shown and described hereinabove. Rather, features recited in separate dependent claims or in the description may advantageously be combined.

Furthermore, the scope of the disclosure includes those variations and modifications, which will be apparent to those skilled in the art and fall within the scope of the appended claims.

The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A pixel arrangement comprising:
   at least one photodiode configured to convert electromagnetic radiation into a respective charge signal;
   a transfer gate between the photodiode and a capacitance configured to transfer the respective charge signal to the capacitance;
   a reset gate electrically coupled to the capacitance, the reset gate configured to reset the capacitance;
   an amplifier electrically connected to the capacitance and configured to generate, based on the respective charge signal and on a sensitivity mode, a respective amplified signal being a low sensitivity signal or a high sensitivity signal, respectively, wherein the low sensitivity signal and the high sensitivity signal are based on a common noise level;
   a first capacitor configured to store the high sensitivity signal;
   a second capacitor configured to store the low sensitivity signal;
   a first switch between an output terminal of the amplifier and the first capacitor; and
   a second switch between the output terminal of the amplifier and the second capacitor,
   wherein the low sensitivity signal is usable as a reference level for the high sensitivity signal thus enabling correlated double sampling.

2. The pixel arrangement according to claim 1, wherein the high sensitivity signal comprises the low sensitivity signal and an additional video signal.

3. The pixel arrangement according to claim 1, further comprising:
   at least one further amplifier comprising an input terminal electrically connected to the first capacitor and/or the second capacitor, the at least one further amplifier configured to generate a pixel output signal at an output terminal of the further amplifier; and
   a select gate between the output terminal of the further amplifier and a column bus for transferring the pixel output signal to the column bus.

4. The pixel arrangement according to claim 1, wherein the at least one photodiode comprises a first photodiode configured to generate a first charge signal in a high sensitivity mode and a second photodiode configured to generate a second charge signal in a low sensitivity mode.

5. The pixel arrangement according to claim 1, further comprising a sensitivity gate between the reset gate and the capacitance configured to short a terminal node of the capacitance with a terminal node of a third capacitor.

6. The pixel arrangement according to claim 1, wherein the first capacitor and the second capacitor are arranged in parallel or are cascaded.

7. An image sensor comprising:
   an array of pixels according to the pixel arrangement of claim 1.

8. A method for operating a pixel arrangement, the method comprising:
   converting electromagnetic radiation into a respective charge signal by at least one photodiode;
   providing a reset signal for resetting a capacitance;

providing a transfer signal for transferring the respective charge signal from the at least one photodiode to the capacitance;

generating, based on the respective charge signal and a sensitivity mode, a respective amplified signal, the respective amplified signal being a low sensitivity signal or a high sensitivity signal, respectively, wherein the low sensitivity signal and the high sensitivity signal are based on a common noise level;

providing a first switch signal for transferring the respective amplified signal to a first capacitor configured to store the high sensitivity signal;

providing a second switch signal for transferring the respective amplified signal to a second capacitor configured to store the low sensitivity signal; and performing correlated double sampling by using the low sensitivity signal as a reference level for the high sensitivity signal.

9. The method according to claim 8, further comprising:
in a first operation, during pixel exposure, operating the pixel arrangement in a low sensitivity mode such that the low sensitivity signal is generated and stored on the second capacitor; and
in a second operation, during pixel exposure, operating the pixel arrangement in a high sensitivity mode such that the high sensitivity signal is generated and stored on the first capacitor,
wherein the first operation and the second operation, during the pixel exposure, are conducted without resetting the capacitance in between.

10. The method according to claim 8, wherein converting the electromagnetic radiation into the respective charge signal comprises generating a first charge signal in a high sensitivity mode by a first photodiode and generating a second charge signal in a low sensitivity mode by a second photodiode.

11. The method according to claim 8, wherein converting the electromagnetic radiation into the respective charge signal comprises generating a first charge signal in a low sensitivity mode by a reduced exposure time and generating a second charge signal in a high sensitivity mode by an increased exposure time.

12. The method according to claim 8, further comprising:
in a first operation, during pixel readout, reading out the low sensitivity signal;
in a second operation, during readout, reading out the high sensitivity signal; and
in a third operation, during the pixel readout, resetting the capacitance and reading out a reset level.

13. The method according to claim 12, further comprising performing double delta sampling by using the reset level as a reference level for the low sensitivity signal.

14. The method according to claim 8, further comprising determining, based on respective amplitude levels, whether to use the low sensitivity signal or the high sensitivity signal for further processing.

15. The method according to claim 8, further comprising adjusting a conversion gain by applying a gain signal for shorting a terminal node of the capacitance with a terminal node of a third capacitor.

16. A method for operating a pixel arrangement, the method comprising:
accumulating, in a first integration period, charge carriers with a photodiode;
pulsing, at an end of the first integration period, a transfer gate to a first voltage level to transfer a portion of the accumulated charge carriers to a capacitance, wherein the portion is configured to be drained to a supply voltage;
continuing to accumulate, in a second integration period, charge carriers with the photodiode;
pulsing, at an end of the second integration period, the transfer gate to the first voltage level for transferring a first part of the accumulated charge carriers to the capacitance, and storing a low sensitivity signal representing the first part of the accumulated charge carriers on at least a second capacitor of a pair of capacitors electrically coupled to the capacitance;
continuing to accumulate, in a third integration period, charge carriers with the photodiode;
pulsing, at an end of the third integration period, the transfer gate to a second voltage level for transferring a remaining part of the accumulated charge carriers to the capacitance, and storing a high sensitivity signal representing the remaining part of the accumulated charge carriers on a first capacitor of the pair of capacitors; and
during a readout period, reading out the low sensitivity signal and the high sensitivity signal stored on the capacitors.

17. The method according to claim 16, wherein the high sensitivity signal indicates a calibration level based on the remaining part of the accumulated charge carriers, and wherein the method further comprises adjusting a pixel output signal based on the low sensitivity signal and the high sensitivity signal dependent on a pixel specific knee point value that is determined based on the calibration level.

18. The method according to claim 16, wherein the first integration period is longer than the second integration period.

19. The method according to claim 16, wherein the second voltage level is larger than the first voltage level.

* * * * *